United States Patent
Itou

(10) Patent No.: US 6,744,689 B2
(45) Date of Patent: Jun. 1, 2004

(54) SEMICONDUCTOR MEMORY DEVICE HAVING A STABLE INTERNAL POWER SUPPLY VOLTAGE

(75) Inventor: Takashi Itou, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/339,323

(22) Filed: Jan. 10, 2003

(65) Prior Publication Data

US 2004/0027906 A1 Feb. 12, 2004

(30) Foreign Application Priority Data

Aug. 8, 2002 (JP) ........................................ 2002-231535

(51) Int. Cl.$^7$ ................................................ G11C 5/14
(52) U.S. Cl. ................... 365/228; 365/226; 365/194; 365/189.09; 365/189.11; 365/233; 365/230.06; 327/535; 327/537; 327/538
(58) Field of Search ................................. 365/226, 228, 365/229, 189.09, 189.11, 194, 233, 230.06; 327/535, 536, 537, 538

(56) References Cited

U.S. PATENT DOCUMENTS 6,385,119 B2 * 5/2002 Kobayashi et al. ......... 365/227
6,496,438 B2 * 12/2002 Saito .......................... 365/226
6,498,760 B2 * 12/2002 Yamasaki ................... 365/226
6,661,729 B2 * 12/2003 Yamasaki ................... 365/226

FOREIGN PATENT DOCUMENTS

JP P2000-40394 A 2/2000 .......... G11C/29/00

* cited by examiner

Primary Examiner—Andrew Q. Tran
(74) Attorney, Agent, or Firm—McDermott, Will & Emery

(57) ABSTRACT

A semiconductor memory device is provided with a power supply circuit. The power supply circuit includes a reference voltage generating circuit which generates a first reference voltage, a booster circuit which generates a first internal power supply voltage by boosting an external power supply voltage using the first reference voltage, another reference voltage generating circuit which generates a second reference voltage, and a VDC circuit which generates a second internal power supply voltage by down-converting the first internal power supply voltage to a voltage level of the second reference voltage. The generated second internal power supply voltage is supplied to a DLL, and the DLL generates a periodic signal having a phase corresponding to the voltage level of the second internal power supply voltage.

15 Claims, 29 Drawing Sheets

SEMICONDUCTOR MEMORY DEVICE HAVING A STABLE INTERNAL POWER SUPPLY VOLTAGE

BACKGROUND OF THE INVENTION

1. Field of the Invention

The present invention relates to semiconductor memory devices, and more particularly to a semiconductor memory device having a power supply circuit generating an internal power supply voltage of a stable voltage level built therein.

2. Description of the Background Art

As a semiconductor memory device of large capacity inputting/outputting data at high speed, a DDR-SDRAM (Double Data Rate Synchronous Dynamic Random Access Memory) has come into practical use.

The DDR-SDRAM inputs/outputs data in synchronization with rising and falling of a periodic signal. To this end, the DDR-SDRAM has a DLL (Delay Locked Loop) circuit generating the periodic signal built therein.

The DDR-SDRAM externally receives complementary clocks CLK, /CLK having a phase difference of 180° with each other. The DLL circuit receives buffered clocks CLK, /CLK, i.e., clocks BUFF_CLK, BUFF_/CLK, and uses the received clocks BUFF_CLK, BUFF_/CLK to generate periodic signals DLLCLK_P, DLLCLK_N.

Generation of periodic signals DLLCLK_P, DLLCLK_N is now described with reference to FIG. 28. The DDR-SDRAM is provided with a VDC (Voltage Down Converter) circuit 1000 and a DLL circuit 1100.

VDC circuit 1000 down coverts and external power supply voltage EXTVDD supplied from the outside of the DDR-SDRAM to a voltage level of a reference voltage VREFP generated within the DDR-SDRAM, to generate an internal power supply voltage VDD4. It provides the generated internal power supply voltage VDD4 to DLL circuit 1100.

DLL circuit 1100 receives clocks BUFF_CLK, BUFF_/CLK, supplied from the outside of the DDR-SDRAM and having undergone buffering, and internal power supply voltage VDD4, and generates periodic signals DLLCLK_P, DLLCLK_N having phases corresponding to the voltage level of internal power supply voltage VDD4. Periodic signal DLLCLK_P has a phase difference of 180° with respect to periodic signal DLLCLK_N. DLL circuit 1100, when locked to an external clock EXTCLK, normally generates periodic signal DLLCLK_P constantly at the same timing with respect to the external clock EXTCLK.

In the DDR-SDRAM, data are input/output in synchronization with periodic signals DLLCLK_P, DLLCLK_N.

Here, there is a problem that the voltage level of external power supply voltage EXTVDD changes. When a noise is superimposed on external power supply voltage EXTVDD, there occurs no problem if the voltage level of internal power supply voltage VDD4 is sufficiently lower than the voltage level of external power supply voltage EXTVDD. However, if the voltage level of internal power supply voltage VDD4 is close to that of external power supply voltage EXTVDD, the noise would be transmitted to internal power supply voltage VDD4. As a result, the rising timing of periodic signal DLLCLK_P would become off the rising timing of external clock EXTCLK.

Specifically, as shown in FIG. 29, in the region where external power supply voltage EXTVDD is free from noise, periodic signal DLLCLK_P always rises at the same timing with respect to the rising of external clock EXTCLK. However, in the region from timing t1 to timing t2 where a noise is superimposed on external power supply voltage EXTVDD, the noise is also superimposed on internal power supply voltage VDD4, and each rising timing of periodic signal DLLCLK_P comes off the respective rising timing of external clock EXTCLK.

In this case, it is difficult for the DDR-SDRAM to input/output data at constant timings.

Such a phase shift of periodic signal DLLCLK_P due to the change of voltage level of external power supply voltage EXTVDD will be prevented if the voltage level of internal power supply voltage VDD4 is kept sufficiently lower than the voltage level of external power supply voltage EXTVDD. If the voltage level of internal power supply voltage VDD4 is made sufficiently low, however, the delay amount in the DLL circuit will increase, which makes minute control on the order of pico-seconds (ps) difficult, so that the operating margin will decrease. As such, it is difficult to keep internal power supply voltage VDD4 to be provided to the DLL circuit at a sufficiently low level.

Japanese Patent Laying-Open No. 2000-40394 discloses an invention related to a DRAM provided with two different power supply circuits. In the invention, one power supply circuit generates a first power supply voltage, and the other power supply circuit generates a second power supply voltage whose voltage level is higher than that of the first power supply voltage.

When the voltage level of the second power supply voltage decreases, the voltage level of the first power supply voltage is decreased such that the voltage level of the first power supply voltage becomes lower than that of the second power supply voltage.

Assume that the first and second power supply voltages correspond to the internal power supply voltage VDD4 and the external power supply voltage EXTVDD herein, respectively. If the internal power supply voltage VDD4 is decreased in accordance with the decrease of external power supply voltage EXTVDD, the operating margin will decrease as described above, hindering a stable operation of the DDR-SDRAM.

The invention of Japanese Patent Laying-Open No. 2000-40394 controls the voltage level of the first power supply voltage in accordance with the voltage level of the second power supply voltage. It does not intend to stabilize the voltage level of one of the power supply voltages.

SUMMARY OF THE INVENTION

Based on the foregoing, an object of the present invention is to provide a semiconductor memory device having a power supply circuit built therein which generates an internal power supply voltage prevented from suffering an influence of an external power supply voltage and permitting a stable operation of the semiconductor memory device.

According to the present invention, the semiconductor memory device includes: a memory cell array storing data; a power supply circuit changing a voltage level of an external power supply voltage to generate a first internal power supply voltage and changing a voltage level of the generated first internal power supply voltage to generate a second internal power supply voltage; a periodic signal generating circuit generating a periodic signal having a phase corresponding to a voltage level of the second internal power supply voltage provided from the power supply circuit; and an output circuit externally outputting read data read out from the memory cell array, in synchronization with the periodic signal In the semiconductor memory device of the present invention, the second internal power supply voltage used in the periodic signal generating circuit is generated by changing the voltage level of the external power supply voltage.

As such, according to the present invention, an internal power supply voltage having a stable voltage level and unlikely to suffer an influence of noise superimposed on the external power supply voltage can be generated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
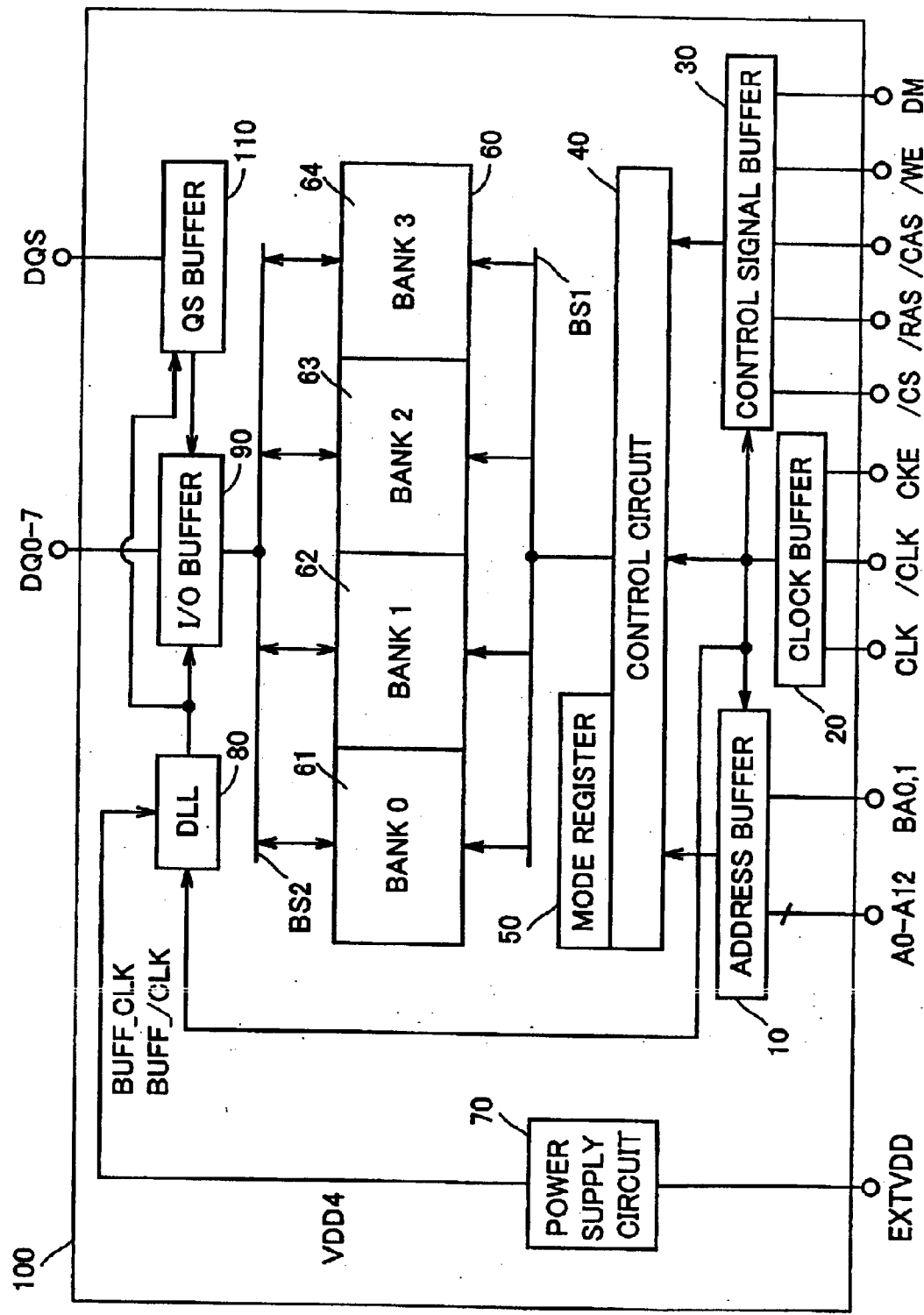
FIG. 1 is a schematic block diagram of a semiconductor memory device according to a first embodiment of the present invention.

Hereinafter, embodiments of the present invention will be described in detail with reference to the drawings. In the drawings, the same or corresponding portions are denoted by the same reference characters, and description thereof will not be repeated.

First Embodiment

Referring to FIG. 1, the semiconductor memory device 100 according to the first embodiment includes an address buffer 10, a clock buffer 20, a control signal buffer 30, a control circuit 40, a mode register 50, a memory cell array 60, a power supply circuit 70, a DLL 80, an I/O buffer 90, a QS buffer 110, and data buses BS1, BS2. Memory cell array 60 includes banks 61–64.

Address buffer 10 receives addresses A0–A12 and bank addresses BA0, 1 and outputs the received addresses A0–A12 and bank addresses BA0, 1 to control circuit 40 in synchronization with clocks BUFF_CLK, BUFF_/CLK received from clock buffer 20.

Clock buffer 20 externally receives clocks CLK, /CLK and a clock enable signal CKE, and buffers the received clocks CLK, CLK/ and clock enable signal CKE. Clock buffer 20 outputs the buffered clocks BUFF_CLK, BUFF/_CLK to address buffer 10, control signal buffer 30, control circuit 40 and DLL 80, and outputs the buffered clock enable signal CKE to control circuit 40.

Control signal buffer 30 externally receives a chip select signal /CS, a row address strobe signal /RAS, a column address strobe signal /CAS, a write enable signal /WE and a data mask signal DM, and buffers and outputs the received chip select signal /CS, row address strobe signal /RAS, column address strobe signal /CAS, write enable signal /WE and data mask signal DM to control circuit 40.

Control circuit 40, when clock enable signal CKE is at an H (logical high) level at a rising of clocks BUFF_CLK, BUFF_/CLK received from clock buffer 20, determines that the next rising of clocks BUFF_CLK, BUFF_/CLK is valid. When clock enable signal CKE is at an L (logical low) level at a rising of clocks BUFF_CLK, BUFF_/CLK, control circuit 40 determines that the next rising of clocks BUFF_CLK, BUFF_/CLK is invalid.

Control circuit 40, when determining that clocks BUFF_CLK, BUFF_/CLK are valid, controls semiconductor memory device 100 based on chip select signal /CS, row address strobe signal /RAS, column address strobe signal /CAS, write enable signal /WE and data mask signal DM received from control signal buffer 30.

More specifically, control circuit 40 recognizes that semiconductor memory device 100 has been selected based on chip select signal /CS of an L level, and recognizes that semiconductor memory device 100 has not been selected based on chip select signal /CS of an H level. Control circuit 40 selects one or all of banks 61–64 based on bank addresses BA0, 1 received from address buffer 10. Further, control circuit 40 regards addresses A0–A12 received from address buffer 10 at a timing when row address strobe signal /RAS changes from an H level to an L level as a row address, and outputs the row address to one or all of banks 61–64 in synchronization with clocks BUFF_CLK, BUFF_/CLK from clock buffer 20.

Further, control circuit 40 regards addresses A0–A12 received from address buffer 10 at a timing when column address strobe signal /CAS changes from an H level to an L level as a column address, and outputs the column address to one or all of banks 61–64 in synchronization with clocks BUFF_CLK, BUFF_/CLK from clock buffer 20.

Still further, control circuit 40 recognizes a write mode or a read mode of data based on write enable signal /WE. In the write mode, control circuit 40 controls I/O buffer 90 such that the write data input from input/output terminals DQ0–DQ7 are input to banks 61–64 in synchronization with a data strobe signal DQS from QS buffer 110, and controls QS buffer 110 such that it outputs the externally supplied data strobe signal DQS to I/O buffer 90. In the read mode, control circuit 40 controls I/O buffer 90 such that the read data read out from banks 61–64 via data bus BS2 are output to input/output terminals DQ0–DQ7 in synchronization with periodic signals DLLCLK_P, DLLCLK_N from DLL 80, and controls QS buffer 110 such that it externally outputs the periodic signals DLLCLK_P, DLLCLK_N from DLL 80.

Moreover, control circuit 40 controls I/O buffer 90 based on data mask signal DM. More specifically, in the write mode, control circuit 40 controls I/O buffer 90, based on data mask signal DM of an H level, such that it does not write the write data to banks 61–64 during a time period where data mask signal DM is at an H level, and controls I/O buffer 90, based on data mask signal DM of an L level, such that it writes all the write data to banks 61–64. In the read mode, control circuit 40 inactivates I/O buffer 90 based on data mask signal DM of an H level, and activates I/O buffer 90 based on data mask signal DM of an L level.

Furthermore, control circuit 40 controls timing from the time when a data read operation is designated to the time when data is actually read, based on CAS latency CL set by mode register 50, and activates or inactivates DLL 80 in accordance with a designation from mode register 50.

Mode register 50 sets the CAS latency CL, and outputs the set CAS latency CL to control circuit 40. Mode register 50 designates activation or inactivation of DLL 80 to control circuit 40.

Memory cell array 60 includes banks 61–64 for storage of data. Power supply circuit 70 generates an internal power supply voltage VDD4 having a stable voltage level based on an externally supplied external power supply voltage EXTVDD in a manner as will be described later, and outputs the generated internal power supply voltage VDD4 to DLL 80.

DLL 80 receives clocks BUFF_CLK, BUFF_/CLK from clock buffer 20 and internal power supply voltage VDD4 from power supply circuit 70, and generates periodic signals DLLCLK_P, DLLCLK_N having phases corresponding to a voltage level of internal power supply voltage VDD4 based on clocks BUFF_CLK, BUFF_/CLK, and outputs the generated periodic signals DLLCLK_P, DLLCLK_N to I/O buffer 90 and QS buffer 110.

I/O buffer 90, in the write mode, writes the write data input from input/output terminals DQ0–DQ7 to banks 61–64 in synchronization with data strobe signal DQS from QS buffer 110. In the read mode, I/O buffer 90 outputs the read data read out from banks 61–64 via data bus BS2 to input/output terminals DQ0–DQ7 in synchronization with periodic signals DLLCLK_P, DLLCLK_N from DLL 80.

QS buffer 110, in the write mode, outputs the externally applied data strobe signal DQS to I/O buffer 90. In the read mode, QS buffer 110 externally outputs periodic signals DLLCLK_P, DLLCLK_N received from DLL 80.

Data bus BS1 inputs addresses A0–A12, row address strobe signal /RAS and other control signals received from control circuit 40 to one or all of banks 61–64. Data bus BS2 transmits write data or read data between one or all of banks 61–64 and I/O buffer 90.

DLL 80 constitutes the periodic signal generating circuit and I/O buffer 90 constitutes the output circuit of the present invention.

Figure 2:
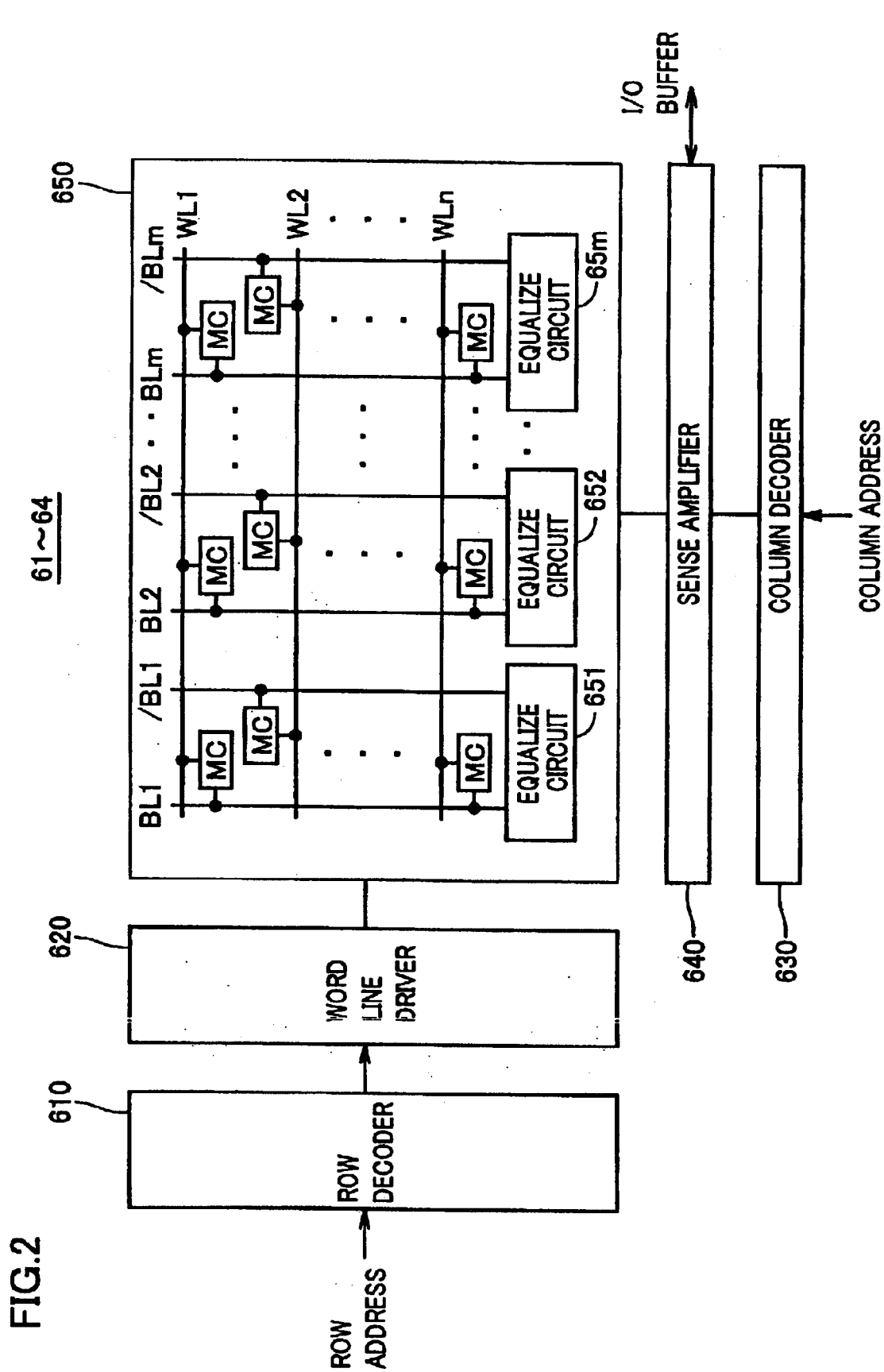
FIG. 2 is a block diagram of the memory cell array shown in FIG. 1.

Referring to FIG. 2, each of banks 61–64 includes a row decoder 610, a word line driver 620, a column decoder 630, a sense amplifier 640, and a memory array 650.

Row decoder 610 decodes a row address received from control circuit 40 and outputs the decoded row address to word line driver 620. Word line driver 620 activates a word line (any of word lines WL1–WLn, n is a natural number) designated by the row address received from row decoder 610.

Column decoder 630 decodes a column address received from control circuit 40, and activates a bit line pair (any of bit line pairs BL1, /BL1 to BLm, /BLm, m is a natural number) designated by the decoded column address. Sense amplifier 640, in the write mode, writes the write data from I/O buffer 90 to the activated bit line pair (any of bit line pairs BL1, /BL1 to BLm, /BLm). In the read mode, sense amplifier 640 amplifies the read data on the activated bit line pair (any of bit line pairs BL1, /BL1 to BLm, /BLm), and outputs the amplified read data to I/O buffer 90.

Memory array 650 includes a plurality of bit line pairs BL1, /BL1 to BLm, /BLm, a plurality of word lines WL1–WLn, a plurality of equalize circuits 651–65m, and n×m memory cells MC. The plurality of equalize circuits 651–65m are provided corresponding to the plurality of bit line pairs BL1, /BL1 to BLm, /BLm. Each of equalize circuits 651–65m precharges the corresponding bit line pair (any of bit line pairs BL1, /BL1 to BLm, /BLm) to a prescribed voltage VBL (=EXTVDD/2) before data is written to or read from memory cell MC.

Each of the n×m memory cells MC is arranged at a crossing of the bit line (any of bit lines BL1–BLm, /BL1-/BLm) and the word line (any of word lines WL1–WLn).

Thus, in memory array 650, data is input to or output from the memory cell MC that is arranged at the crossing of the activated word line (any of word lines WL1–WLn) and the activated bit line (any of bit lines BL1–BLm, /BL1-/BLm).

Figure 3:
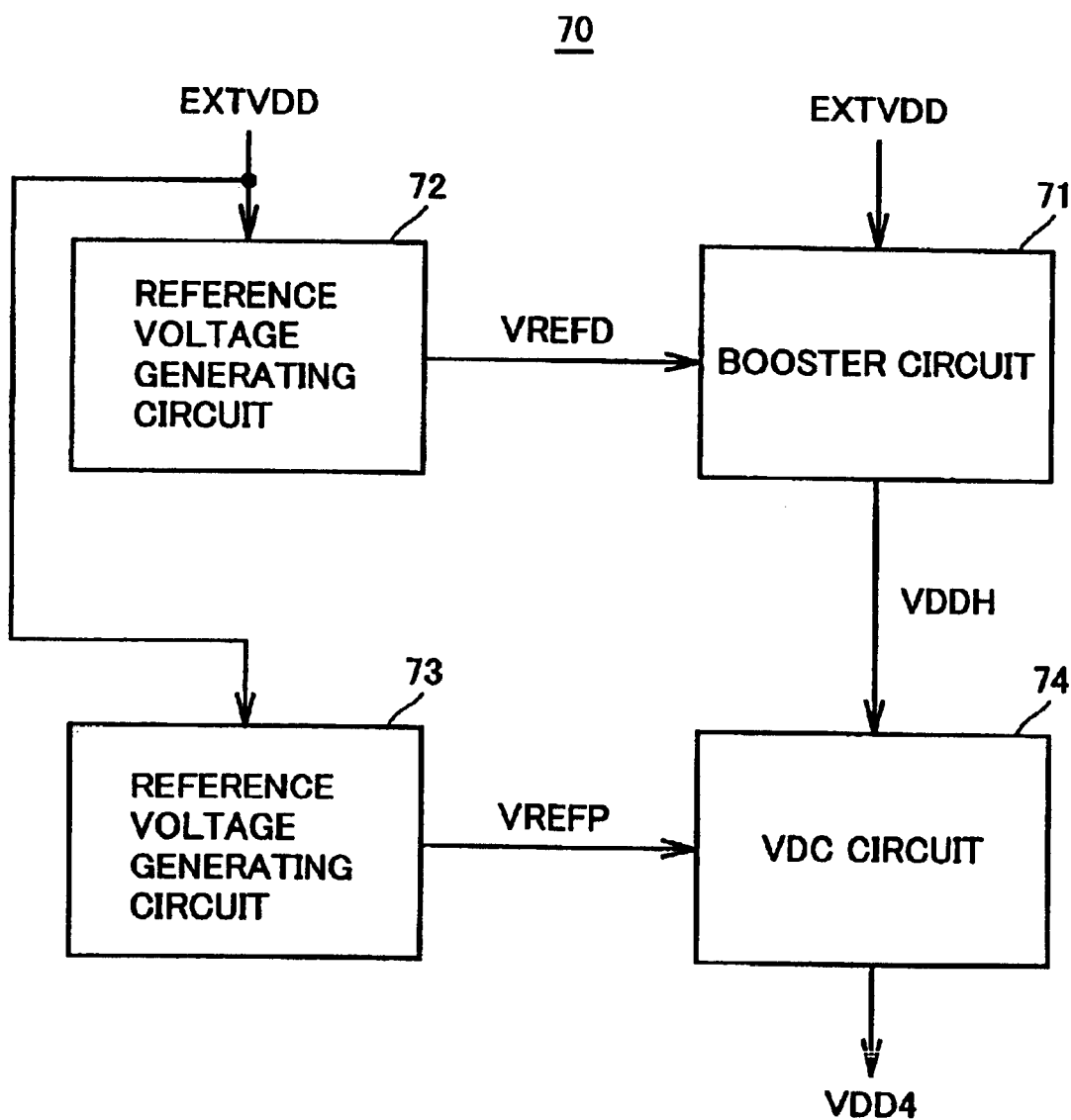
FIG. 3 is a block diagram of the power supply circuit shown in FIG. 1.

Referring to FIG. 3, power supply circuit 70 includes a booster circuit 71, reference voltage generating circuits 72, 73 and a VDC circuit (down converter circuit) 74.

Booster circuit 71 generates an internal power supply voltage VDDH having a voltage level boosted from that of external power supply voltage EXTVDD based on external power supply voltage EXTVDD externally applied and a reference voltage VREFD received from reference voltage generating circuit 72. Booster circuit 71 outputs the generated internal power supply voltage VDDH to VDC circuit 74.

Reference voltage generating circuit 72 generates reference voltage VREFD based on externally applied external power supply voltage EXTVDD, and outputs the generated reference voltage VREFD to booster circuit 71.

Reference voltage generating circuit 73 generates a reference voltage VREFP based on externally applied external power supply voltage EXTVDD, and outputs the generated reference voltage VREFP to VDC circuit 74.

VDC circuit 74 down converts internal power supply voltage VDDH from booster circuit 71 to a voltage level of reference voltage VREFP from reference voltage generating circuit 73 to generate an internal power supply voltage VDD4, and outputs the generated internal power supply voltage VDD4 to DLL 80.

External power supply voltage EXTVDD is in the range of 2.3–2.5 V, and internal power supply voltage VDDH is not lower than 3.0 V. Internal power supply voltage VDD4 is in the range of 1.9–2.1 V.

Figure 4:
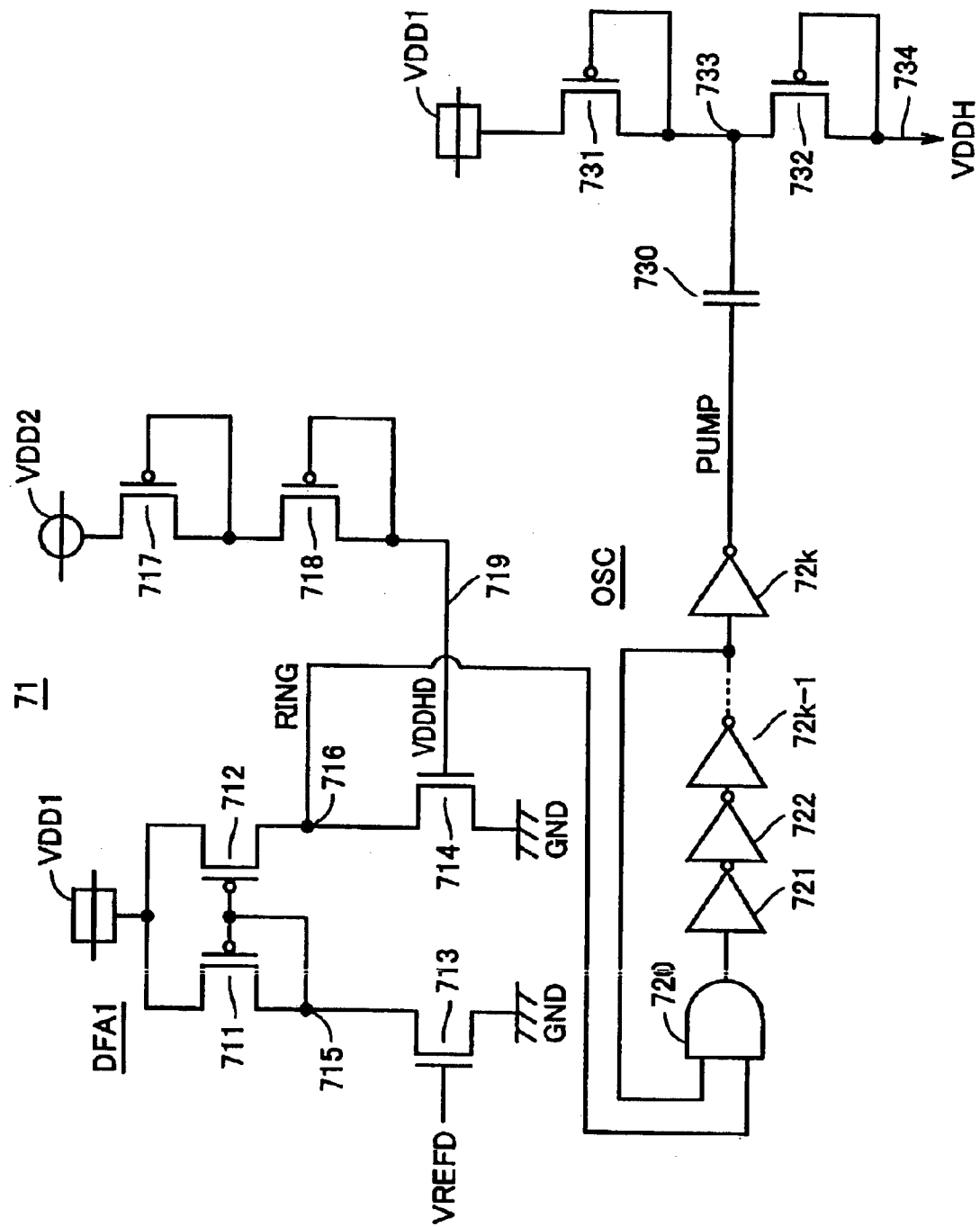
FIG. 4 is a circuit diagram of the booster circuit shown in FIG. 1.

Referring to FIG. 4, booster circuit 71 includes P channel MOS transistors 711, 712, 717, 718, 731, 732, N channel MOS transistors 713, 714, an AND gate 720, inverters 721–72k (k is an odd natural number), and a capacitor 730.

P channel MOS transistor 711 and N channel MOS transistor 713 are connected in series between a power supply node VDD1 and a ground node GND. P channel MOS transistor 712 and N channel MOS transistor 714 are connected in series between power supply node VDD1 and ground node GND. P channel MOS transistor 711 and N channel MOS transistor 713 are connected in parallel with respect to P channel MOS transistor 712 and N channel MOS transistor 714.

P channel MOS transistors 711, 712 have their gate terminals receiving a voltage on a node 715. N channel MOS transistor 713 has a gate terminal receiving reference voltage VREFD from reference voltage generating circuit 72. N channel MOS transistor 714 has a gate terminal receiving voltage VDDHD on a node 719. Power supply node VDD1 receives externally supplied external power supply voltage EXTVDD.

P channel MOS transistors 717, 718 are connected in series between a power supply node VDD2 and node 719. Each of P channel MOS transistors 717, 718 is diode-connected. Power supply node VDD2 receives internal power supply voltage VDDH generated by booster circuit 71.

Thus, P channel MOS transistors 717, 718 function as a resistance, and outputs to node 719 the voltage VDDHD having a voltage level reduced from that of internal power supply voltage VDDH applied to power supply node VDD2.

P channel MOS transistors 711, 712 and N channel MOS transistors 713, 714 constitute a current mirror-type differential amplifier circuit DFA1, which compares voltage VDDHD having a voltage level lowered from that of internal power supply voltage VDDH with reference voltage VREFD from reference voltage generating circuit 72, and outputs a signal RING having a voltage level corresponding to the comparison result, from a node 716 to one terminal of AND gate 720.

In this case, when the voltage level of voltage VDDHD is higher than the voltage level of reference voltage VREFD, differential amplifier circuit DFA1 outputs signal RING of an L level to the one terminal of AND gate 720. When the voltage level of voltage VDDHD is lower than that of reference voltage VREFD, differential amplifier circuit DFA1 outputs signal RING of an H level to the one terminal of AND gate 720.

Thus, differential amplifier circuit DFA1 detects a voltage level of voltage VDDHD by comparing voltage VDDHD having a voltage level lowered from that of internal power supply voltage VDDH with reference voltage VREFD. This detection of the voltage level of voltage VDDHD corresponds to the detection of the voltage level of internal power supply voltage VDDH.

AND gate 720 receives signal RING at the one terminal and receives an output signal of an inverter 72k-1 at the other terminal. AND gate 720 performs an AND operation of the received two signals, and outputs the result to inverter 721.

An odd number of inverters 721 to 72k are connected in series. Inverter 72k-1 inverts the input signal, and outputs the inverted signal to inverter 72k and to the other terminal of AND gate 720. Inverters 721 to 72k-2 invert the input signals and output the inverted signals to inverters 722 to 72k-1, respectively. Inverter 72k inverts the output signal of inverter 72k-1, and outputs a signal PUMP to capacitor 730.

AND gate 720 and inverters 721–72k constitute an oscillator OSC. Oscillator OSC, when receiving signal RING of an H level from differential amplifier circuit DFA1, outputs signal PUMP of an L level to capacitor 730. When receiving signal RING of an L level from differential amplifier circuit DFA1, it outputs signal PUMP of an H level to capacitor 730.

Capacitor 730 is connected between inverter 72k and a node 733. P channel MOS transistors 731, 732 are connected in series between power supply node VDD1 and a node 734. Each of P channel MOS transistors 731 and 732 is diode-connected.

When signal PUMP of an L level is output from oscillator OSC, negative charges accumulate on one electrode of capacitor 730, and positive charges are induced to the other electrode of capacitor 730 on the node 733 side. Thus, capacitor 730 accumulates the positive charges from power supply node VDD1 to a node 733 via P channel MOS transistor 731. Correspondingly, the voltage on node 733 increases, and the positive charges on node 733 flow through P channel MOS transistor 732 to node 734. The accumulation of positive charges on node 734 continues during a time period where capacitor 730 is receiving signal PUMP of an L level from oscillator OSC. Node 734 thus outputs the internal power supply voltage VDDH having a voltage level boosted from that of external power supply voltage EXTVDD.

On the other hand, when capacitor 730 receives signal PUMP of an H level from oscillator OSC, positive charges accumulate on the one electrode of capacitor 730. Thus, capacitor 730 decreases the current amount to be flown from power supply node VDD1 via P channel MOS transistor 731 to node 733. As a result, the current amount flowing from node 733 via P channel MOS transistor 732 to node 734 decreases, so that the voltage level of internal power supply voltage VDDH decreases.

When the voltage level of internal power supply voltage VDDH decreases and the voltage level of voltage VDDHD becomes lower than that of reference voltage VREFD, differential amplifier circuit DFA1 outputs signal RING of an H level to the one terminal of AND gate 720. Correspondingly, oscillator OSC outputs signal PUMP of an L level to capacitor 730, so that the current flowing from power supply node VDD1 via P channel MOS transistors 731, 732 to node 734 increases, and accordingly, the voltage level of internal power supply voltage VDDH increases.

When the voltage level of internal power supply voltage VDDH increases and the voltage level of voltage VDDHD becomes greater than that of reference voltage VREFD, differential amplifier circuit DFA1 outputs signal RING of an L level to the one terminal of AND gate 720. Correspondingly, oscillator OSC outputs signal PUMP of an H level to capacitor 730, and the current flowing from power supply node VDD1 via P channel MOS transistors 731, 732 to node 734 decreases. Thus, the voltage level of internal power supply voltage VDDH decreases.

As such, booster circuit 71 detects a voltage level of generated internal power supply voltage VDDH using reference voltage VREFD, and controls the current amount to be supplied from power supply node VDD1 to node 734 in accordance with the detected voltage level of internal power supply voltage VDDH. Booster circuit 71 thus maintains internal power supply voltage VDDH, generated by boosting external power supply voltage EXTVDD, at a constant voltage level.

Figure 5:
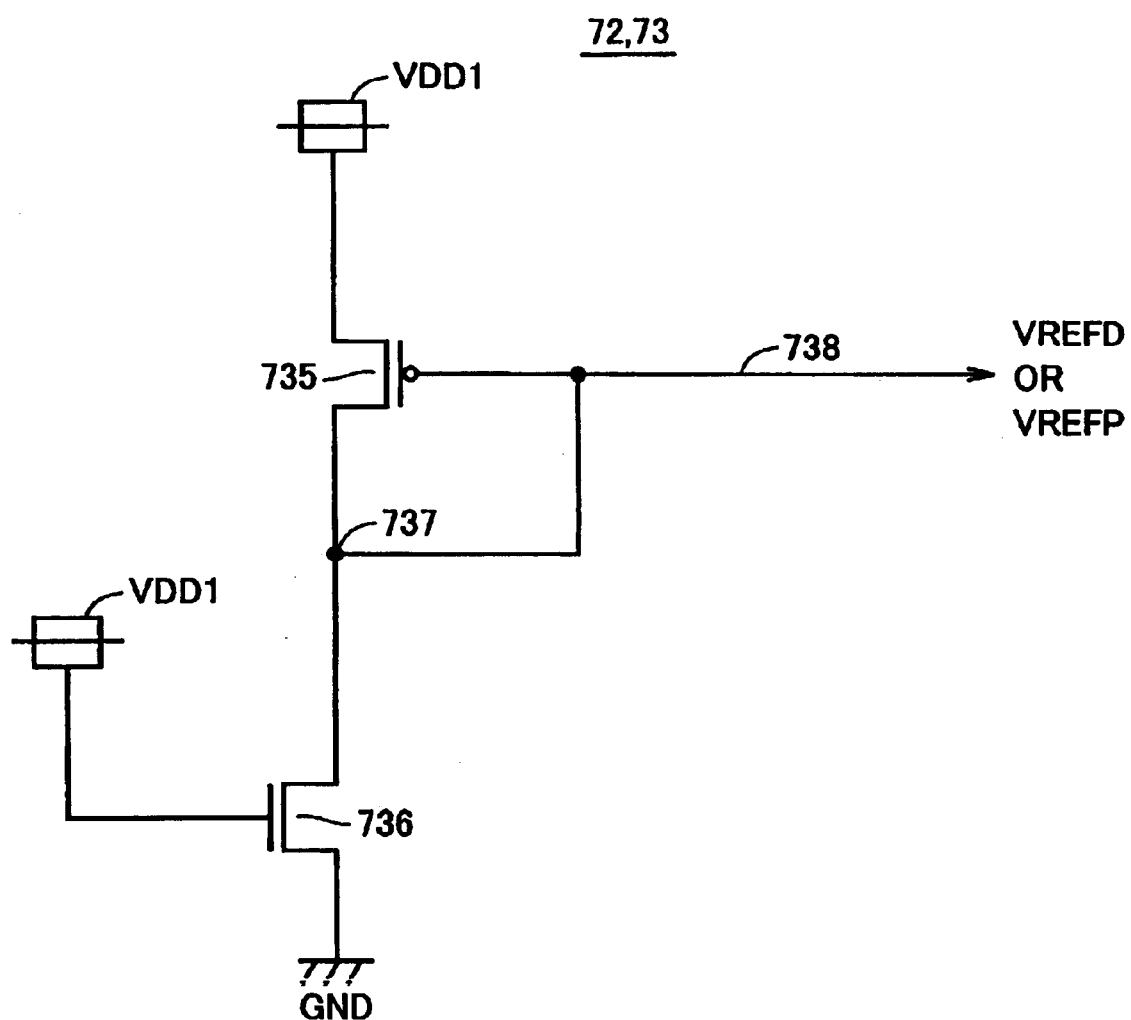
FIG. 5 is a circuit diagram of the reference voltage generating circuit shown in FIG. 3.

Referring to FIG. 5, each of reference voltage generating circuits 72, 73 includes a P channel MOS transistor 735 and an N channel MOS transistor 736. P channel MOS transistor 735 and N channel MOS transistor 736 are connected in series between power supply node VDD1 and ground node GND.

P channel MOS transistor 735 is diode-connected, and has its gate terminal receiving a voltage on a node 737. N channel MOS transistor 736 has its gate terminal receiving external power supply voltage EXTVDD supplied to power supply node VDD1.

Thus, P channel MOS transistor 735 and N channel MOS transistor 736 output, from node 738, reference voltage VREFD or VREFP having a voltage level decreased from that of external power supply voltage EXTVDD supplied to power supply node VDD1.

The voltage levels of respective reference voltages VREFD, VREFP are determined according to the sizes of P channel MOS transistor 735 and N channel MOS transistor 736. The voltage level of reference voltage VREFD differs from the voltage level of reference voltage VREFP. Thus, the sizes of P channel MOS transistor 735 and N channel MOS transistor 736 are differentiated according to whether they are used for reference voltage generating circuit 72 or reference voltage generating circuit 73.

Figure 6:
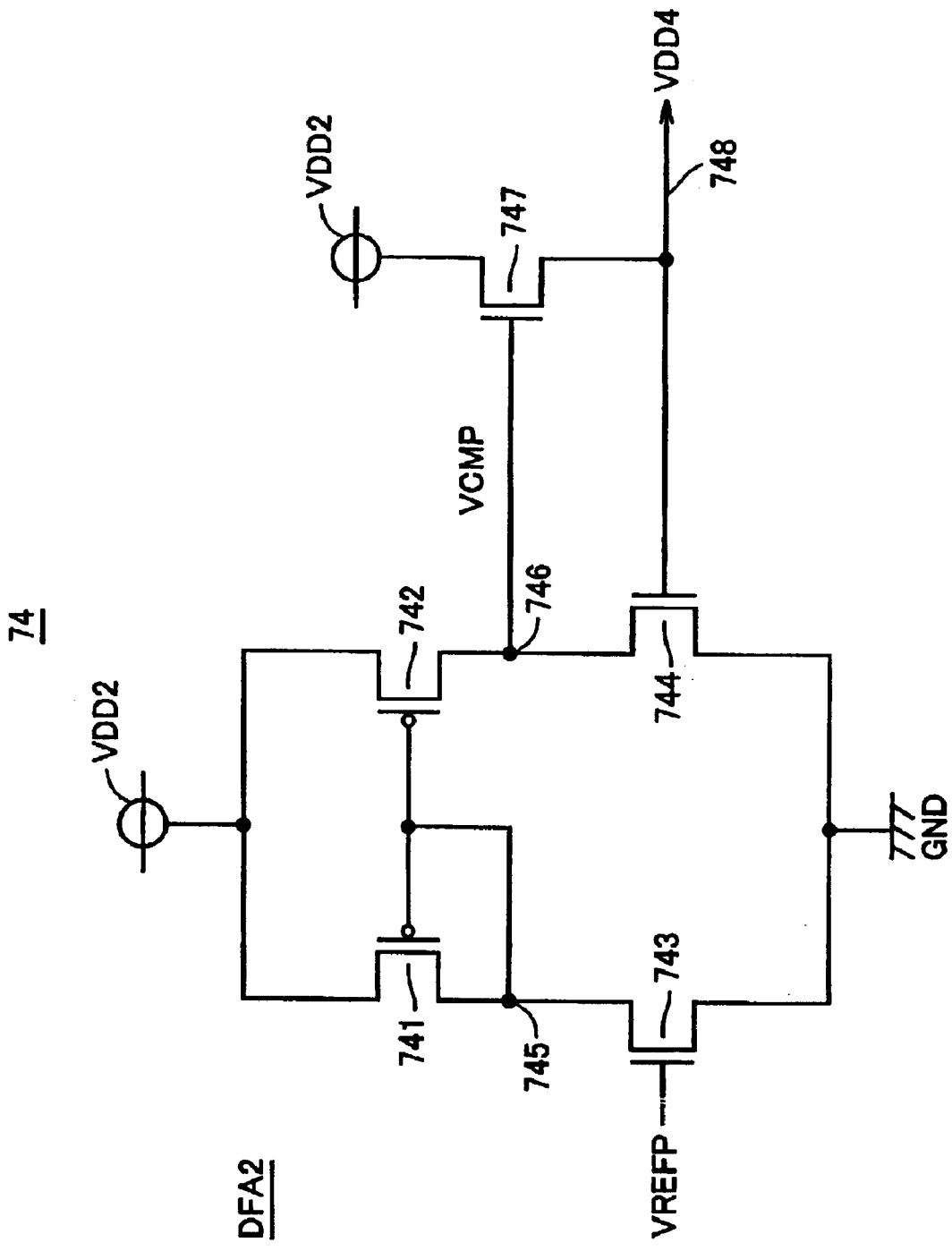
FIG. 6 is a circuit diagram of the VDC circuit shown in FIG. 3.

Referring to FIG. 6, VDC circuit 74 includes P channel MOS transistors 741, 742 and N channel MOS transistors 743, 744, 747.

P channel MOS transistor 741 and N channel MOS transistor 743 are connected in series between power supply node VDD2 and ground node GND. P channel MOS transistor 742 and N channel MOS transistor 744 are connected in series between power supply node VDD2 and ground node GND. P channel MOS transistor 741 and N channel MOS transistor 743 are connected in parallel with respect to P channel MOS transistor 742 and N channel MOS transistor 744.

P channel MOS transistors 741, 742 have their gate terminals receiving a voltage on a node 745. N channel MOS transistor 743 has its gate terminal receiving reference voltage VREFP from reference voltage generating circuit 73. N channel MOS transistor 744 has its gate terminal receiving internal power supply voltage VDD4 on a node 748. Power supply node VDD2 receives internal power supply voltage VDDH generated by booster circuit 71.

P channel MOS transistors 741, 742 and N channel MOS transistors 743, 744 constitute a current mirror-type differential amplifier circuit DFA2. Differential amplifier circuit DFA2 compares internal power supply voltage VDD4 with reference voltage VREFP, and outputs a voltage VCMP having a voltage level corresponding to the comparison result, from node 746 to a gate terminal of N channel MOS transistor 747.

More specifically, when internal power supply voltage VDD4 is lower than reference voltage VREFP, differential amplifier circuit DFA2 outputs from node 746 voltage VCMP having a voltage level greater than that of a reference voltage VSTD. When internal power supply voltage VDD4 is not lower than reference voltage VREFP, differential amplifier circuit DFA2 of reference voltage VSTD. Reference voltage VSTD is a voltage that is applied to the gate terminal of N channel MOS transistor 747 when internal power supply voltage VDD4 has attained a predetermined voltage level.

N channel MOS transistor 747 is connected between power supply node VDD2 and node 748. N channel MOS transistor 747 passes a current from power supply node VDD2 to node 748 in accordance with the voltage level of voltage VCMP received from differential amplifier circuit DFA2. VDC circuit 74 thus generates internal power supply voltage VDD4 having a voltage level down-converted from that of internal power supply voltage VDDH supplied to power supply node VDD2.

N channel MOS transistor 747 constitutes a driver circuit.

When the voltage level of internal power supply voltage VDD4 becomes lower than the voltage level of reference voltage VREFP, differential amplifier circuit DFA2 outputs voltage VCMP having a voltage level greater than that of reference voltage VSTD from node 746 to the gate terminal of N channel MOS transistor 747. N channel MOS transistor 747 increases the current to be passed from power supply node VDD2 to node 748, to increase the voltage level of internal power supply voltage VDD4 on node 748.

When the voltage level of internal power supply voltage VDD4 reaches or exceeds the voltage level of reference voltage VREFP, differential amplifier circuit DFA2 outputs voltage VCMP having a voltage level lower than that of reference voltage VSTD to the gate terminal of N channel MOS transistor 747. N channel MOS transistor 747 decreases the current to be flown from power supply node VDD2 to node 748, thereby decreasing the voltage level of internal power supply voltage VDD4 on node 748.

As such, VDC circuit 74 generates internal power supply voltage VDD4 by down-converting internal power supply voltage VDDH, and controls the voltage level of internal power supply voltage VDD4 to equal the voltage level of reference voltage VREFP.

Figure 7:
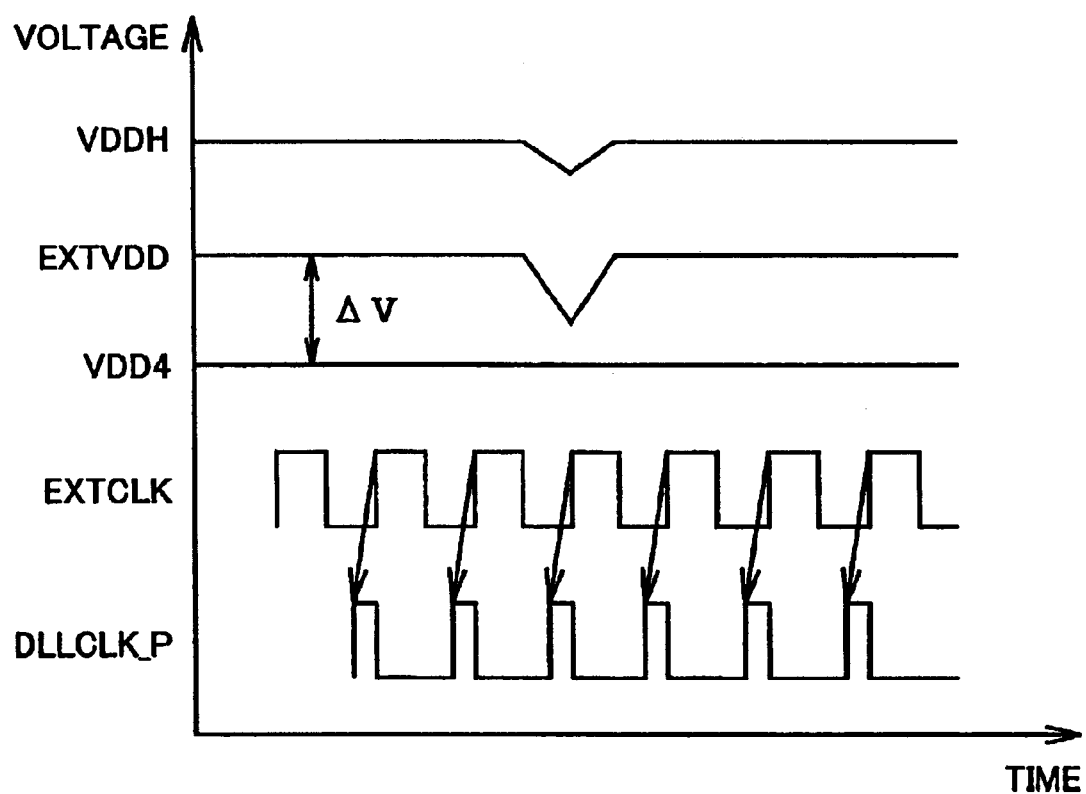
FIG. 7 is a timing chart of voltages used in the power supply circuit and signals used in the DLL shown in FIG. 1.

The operation of power supply circuit 70 is now explained with reference to FIG. 7. A voltage difference between external power supply voltage EXTVDD and internal power supply voltage VDD4 is represented as $\Delta V$.

When external power supply voltage EXTVDD is externally supplied, reference voltage generating circuit 72 in power supply circuit 70 generates reference voltage VREFD having a voltage level lowered from that of external power supply voltage EXTVDD in the manner as described above, and outputs the generated reference voltage VREFD to booster circuit 71. Booster circuit 71 receives external power supply voltage EXTVDD and reference voltage VREFD, and generates internal power supply voltage VDDH by boosting external power supply voltage EXTVDD in the above-described manner, and outputs the generated internal power supply voltage VDDH to VDC circuit 74.

In this case, when a noise is superimposed on external power supply voltage EXTVDD, the relevant noise is transmitted to internal power supply voltage VDDH. The level of the noise transmitted to internal power supply voltage VDDH becomes lower than the level of the noise superimposed on external power supply voltage EXTVDD.

Reference voltage generating circuit 73 receives external power supply voltage EXTVDD, and generates reference voltage VREFP having a voltage level lowered from that of external power supply voltage EXTVDD in the manner as described above, and outputs the generated reference voltage VREFP to VDC circuit 74. VDC circuit 74 receives internal power supply voltage VDDH and reference voltage VREFP, and generates internal power supply voltage VDD4 by down-converting internal power supply voltage VDDH to a voltage level of reference voltage VREFP in the above-described manner, and outputs the generated internal power supply voltage VDD4 to DLL 80.

Generating the internal power supply voltage VDD4 by down-converting the internal power supply voltage VDDH prevents the noise transmitted to internal power supply voltage VDDH from being transmitted to internal power supply voltage VDD4. Thus, internal power supply voltage VDD4 has a stable voltage level.

As a result, DLL 80 generates periodic signal DLLCLK_P having constant timings with respect to external clock EXTCLK based on clock BUFF_CLK received from clock buffer 20. That is, DLL 80 generates periodic signal DLLCLK_P having a constant phase corresponding to the voltage level of internal power supply voltage VDD4 based on clock BUFF_CLK.

DLL 80 also generates periodic signal DLLCLK_N having a phase difference of 180° from periodic signal DLLCLK_P, based on clock BUFF_/CLK from clock buffer 20.

As such, even if a noise is superimposed on externally supplied external power supply voltage EXTVDD, power supply circuit 70 generates internal power supply voltage VDD4 from which the noise is eliminated, and supplies the generated internal power supply voltage VDD4 to DLL 80. This permits DLL 80 to generate periodic signals DLLCLK_P, DLLCLK_N having constant timings with respect to external clock EXTCLK. As a result, the read data can be output at constant timings from semiconductor memory device 100.

The data write/read operations to/from semiconductor memory device 100 are now explained with reference to FIGS. 1 and 2 again. Here, it is assumed that bit line pairs BL1, /BL1 to BLm, /BLm have been precharged to a prescribed voltage VBL level.

Firstly, the operation of writing data to semiconductor memory device 100 is explained.

Clock buffer 20 buffers externally supplied clocks CLK, /CLK and clock enable signal CKE, and outputs the buffered clocks BUFF_CLK, BUFF_/CLK to address buffer 10, control signal buffer 30, control circuit 40 and DLL 80. Clock buffer 20 outputs the buffered clock enable signal CKE to control circuit 40.

In response, control circuit 40 determines whether clock enable signal CKE is at an H level or an L level at a certain rising of clocks BUFF_CLK, BUFF_/CLK, and causes semiconductor memory device 100 to attain a stopped state if it is at an L level. When control circuit 40 determines that cock enable signal CKE is at an H level at a certain rising of clocks BUFF_CLK, BUFF_/CLK, it regards clocks BUFF_CLK, BUFF_/CLK as valid, and causes semiconductor memory device 100 to attain an operating state.

In the write mode, mode register 50 designates control circuit 40 to inactivate DLL 80, and thus, control circuit 40 inactivates DLL 80. Address buffer 10 externally receives bank addresses BA0, 1 and addresses A0–A12, and outputs the received bank addresses BA0, 1 and addresses A0–A12 to control circuit 40 in synchronization with clocks BUFF_CLK, BUFF_/CLK supplied from clock buffer 20. Control signal buffer 30 externally receives chip select signal /CS of an L level, row address strobe signal /RAS of an L level, column address strobe signal /CAS of an L level, and write enable signal /WE of an H level, and buffers and outputs the received chip select signal /CS of the L level, row address strobe signal /RAS of the L level, column address strobe signal /CAS of the L level, and write enable signal /WE of the L level to control circuit 40.

In response, control circuit 40 recognizes that semiconductor memory device 100 has been selected, based on chip select signal /CS of the L level, and selects a bank (any of banks 61–64) that has been designated by bank addresses BA0, 1. Control circuit 40 causes semiconductor memory device 100 to enter the write mode, in accordance with write enable signal /WE of the L level.

Control circuit 40 regards addresses A0–A12 input from address buffer 10 at a timing when row address strobe signal /RAS changes from an H level to an L level as a row address, and outputs the row address to the selected bank (any of banks 61–64) in synchronization with clocks BUFF_CLK, BUFF_/CLK. Control circuit 40 regards the addresses A0–A12 input from address buffer 10 at a timing when column address strobe signal /CAS changes from an H level to an L level as a column address, and outputs the column address to the selected bank (any of banks 61–64) in synchronization with clocks BUFF_CLK, BUFF_/CLK.

QS buffer 110 externally receives data strobe signal DQS, and buffers and outputs the received data strobe signal DQS to I/O buffer 90. I/O buffer 90 receives write data from input/output terminals DQ0–DQ7, and outputs the received write data to the selected bank (any of banks 61–64) in synchronization with data strobe signal DQS.

In response, in the selected bank (any of banks 61–64), row decoder 610 decodes the row address and outputs the decoded row address to word line driver 620. Word line driver 620 activates word line WLi (i is a natural number satisfying $1 \leq i \leq n$) designated by the decoded row address.

Column decoder 630 decodes the column address, and activates bit line pair BLj, /BLj (is a natural number satisfying $1 \leq j \leq m$) designated by the decoded column address. Sense amplifier 640 writes the write data received from I/O buffer 90 to activated bit line pair BLj, /BLj. The write data is thus written into memory cell MC arranged at the crossing of activated word line WLi and activated bit line pair BLj, /BLj, and the data writing operation to semiconductor memory device 100 is completed.

Next, the operation of reading data from semiconductor memory device 100 is explained.

When external power supply voltage EXTVDD is externally supplied, power supply circuit 70 generates internal power supply voltage VDD4 having a stable voltage level in the manner as described above, and supplies the generated internal power supply voltage VDD4 to DLL 80. Clock buffer 20 buffers externally supplied clocks CLK, /CLK and clock enable signal CKE, and outputs the buffered clocks BUFF_CLK, BUFF_/CLK to address buffer 10, control signal buffer 30, control circuit 40 and DLL 80. Clock buffer 20 outputs the buffered clock enable signal CKE to control circuit 40.

In response, control circuit 40 determines whether clock enable signal CKE is at an H level or an L level at a certain rising of clocks BUFF_CLK BUFF_/CLK, and brings semiconductor memory device 100 to a stopped state when it is at an L level. When control circuit 40 determines that clock enable signal CKE is at an H level at a certain rising of clocks BUFF_CLK, BUFF_/CLK, it regards clocks BUFF_CLK, BUFF_/CLK as valid, and brings semiconductor memory device 100 to an operating state.

Mode register 50 sets CAS latency CL, and outputs the CAS latency CL to control circuit 40. Control circuit 40 adjusts the output timing of read data in accordance with the CAS latency CL set by mode register 50.

DLL 80 generates periodic signals DLLCLK_P, DLLCLK_N having phases corresponding to the voltage level of internal power supply voltage VDD4 from power supply circuit 70, based on clocks BUFF_CLK, BUFF_/CLK from clock buffer 20. DLL 80 outputs the generated periodic signals DLLCLK_P, DLLCLK_N to I/O buffer 90 and QS buffer 110.

Address buffer 10 externally receives bank addresses BA0, 1 and addresses A0–A12, and outputs the received bank addresses BA0, 1 and addresses A0–A12 to control circuit 40 in synchronization with clocks BUFF_CLK, BUFF_/CLK supplied from clock buffer 20. Control signal buffer 30 externally receives chip select signal /CS of an L level, row address strobe signal /RAS of an L level, column address strobe signal /CAS of an L level and write enable signal /WE of an H level, and buffers and outputs the received chip select signal /CS of the L level, row address strobe signal /RAS of the L level, column address strobe signal /CAS of the L level and write enable signal /WE of the H level to control circuit 40.

In response, control circuit 40 recognizes that semiconductor memory device 100 has been selected in response to the chip select signal /CS of the L level, and selects the bank (any of banks 61–64) designated by bank addresses BA0, 1. Control circuit 40 causes semiconductor memory device 100 to enter the read mode in response to the write enable signal /WE of the H level.

Control circuit 40 regards addresses A0–A12 input from address buffer 10 at a timing when row address strobe signal /RAS changes from an H level to an L level as a row address, and outputs the row address to the selected bank (any of banks 61–64) in synchronization with clocks BUFF_CLK, BUFF_/CLK. Control circuit 40 regards addresses A0–A12 input from address buffer 10 at a timing when column address strobe signal /CAS changes from an H level to an L level as a column address, and outputs the column address to the selected bank (any of banks 61–64) in synchronization with docks BUFF_CLK, BUFF_/CLK.

In response, in the selected bank (any of banks 61–64), row decoder 610 decodes the row address, and outputs the decoded row address to word line driver 620. Word line driver 620 activates word line WLi designated by the decoded row address.

Column decoder 630 decodes the column address, and activates bit line pair BLj, /BLj designated by the decoded column address. Data is read from the memory cell MC arranged at the crossing of the activated word line WLi and the activated bit line pair BLj, /BLj, and sense amplifier 640 amplifies the read data on bit line pair BLj, /BLj to output to I/O buffer 90.

I/O buffer 90 outputs the read data received from sense amplifier 640 of the selected bank (any of banks 61–64) to input/output terminals DQ0–DQ7 in synchronization with periodic signals DLLCLK_P, DLLCLK_N from DLL 80. QS buffer 110 externally outputs the periodic signals DLLCLK_P, DLLCLK_N from DLL 80. Thus, the data reading operation from semiconductor memory device 100 is completed.

According to the first embodiment, the semiconductor memory device is provided with a power supply circuit which generates internal power supply voltage VDDH by boosting external power supply voltage EXTVDD, and generates internal power supply voltage VDD4 by downconverting the generated internal power supply voltage VDDH to a voltage level lower than that of external power supply voltage EXTVDD. Thus, even if a noise is superimposed on the external power supply voltage, internal power supply voltage VDD4 is generated from which the noise is eliminated. As a result, the rising timings of the periodic signals generated in the DLL can be kept constant with respect to the rising timings of the external clock, even if a noise is superimposed on the external power supply voltage. Thus, the semiconductor memory device is capable of outputting the read data at the constant timings.

Second Embodiment

Figure 8:
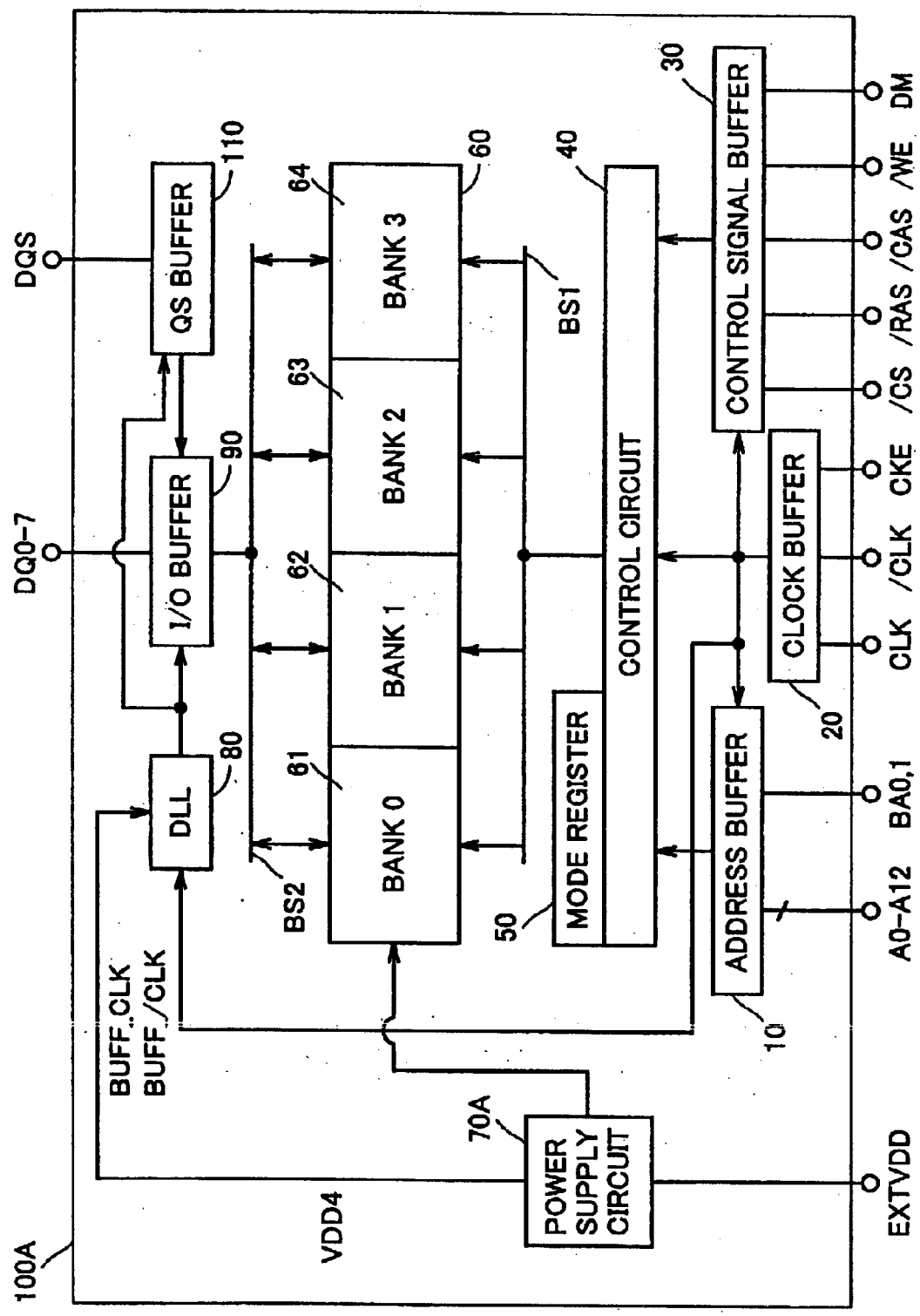
FIG. 8 is a schematic block diagram of a semiconductor memory device according to a second embodiment of the present invention.

Referring to FIG. 8, the semiconductor memory device 100A according to the second embodiment is identical to semiconductor memory device 100 except that power supply circuit 70 of semiconductor memory device 100 is replaced with a power supply circuit 70A.

Figure 9:
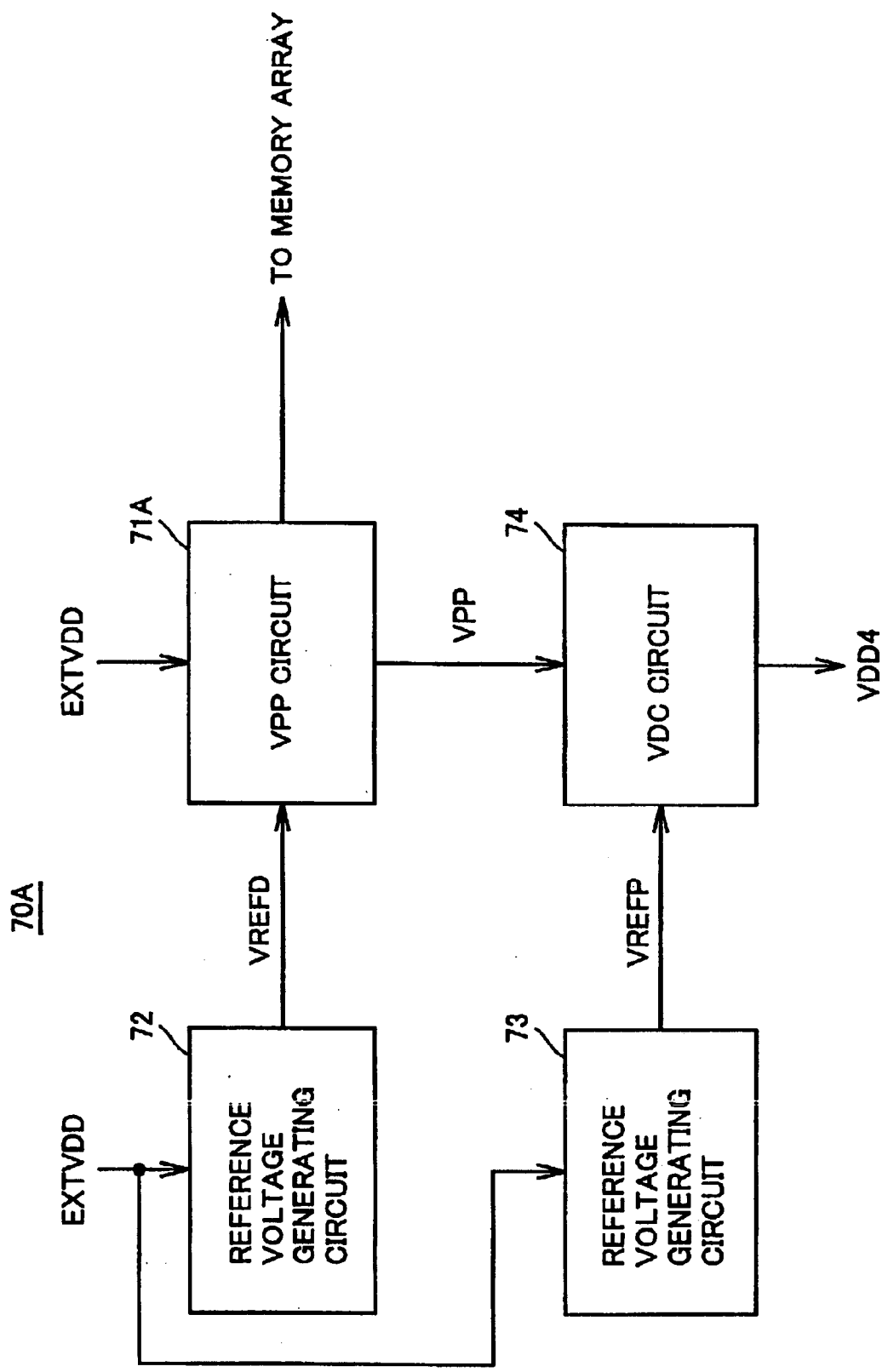
FIG. 9 is a block diagram of the power supply circuit shown in FIG. 8.

Referring to FIG. 9, power supply circuit 70A is identical to power supply circuit 70 except that booster circuit 71 is replaced with a VPP circuit 71A. VPP circuit 71A has the same circuit configuration as booster circuit 71 of power supply circuit 70 (see FIG. 4). In VPP circuit 71A, power supply node VDD2 receives a voltage VPP having a voltage level increased from that of external power supply voltage EXTVDD. VPP circuit 71A boosts external power supply voltage EXTVDD in the same manner as in booster circuit 71 to generate voltage VPP, and outputs the generated voltage VPP to VDC circuit 74 and word line drivers 620 included in banks 61–64. The voltage VPP is used for activating word line WLi.

Thus, by replacement of booster circuit 71 of power supply circuit 70 with VPP circuit 71A, power supply circuit 70A generates internal power supply voltage VDD4 having a stable voltage level using voltage VPP for activating word line WLi.

The VPP circuit constitutes the boosted voltage generating circuit of the present invention.

The operation of power supply circuit 70A is identical to that of power supply circuit 70 of the first embodiment described above, if booster circuit 71 is replaced with VPP circuit 71A and internal power supply voltage VDDH is replaced with voltage VPP.

Figure 10:
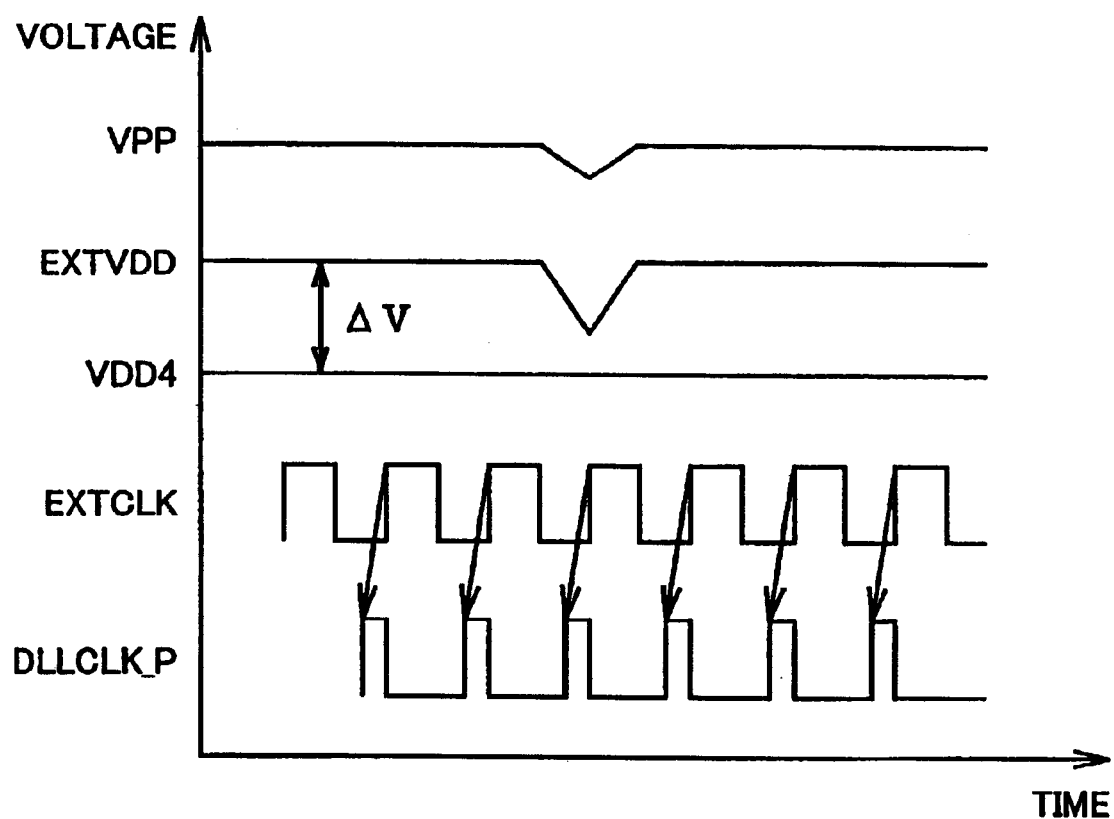
FIG. 10 is a timing chart of voltages used in the power supply circuit and signals used in the DLL shown in FIG. 8.

As a result, as shown in FIG. 10, even if a noise is superimposed on external power supply voltage EXTVDD, the level of the noise being transmitted to voltage VPP decreases, and internal power supply voltage VDD4, generated by down-converting voltage VPP, becomes free from the noise. DLL 80 thus generates periodic signal DLLCLK_P having a constant phase difference with respect to each rising timing of external clock EXTCLK, even if a noise is superimposed on external power supply voltage EXTVDD.

Otherwise, the second embodiment is identical to the first embodiment.

According to the second embodiment, the semiconductor memory device is provided with a power supply circuit which includes a VPP circuit generating a boosted voltage for activating a word line and which generates voltage VPP by boosting external power supply voltage EXTVDD and then generates internal power supply voltage VDD4 by down-converting the generated voltage VPP to a voltage level lower than that of external power supply voltage EXTVDD. As such, internal power supply voltage VDD4 free from noise can be generated even if a noise is superimposed on the external power supply voltage, with increased area efficiency of the power supply circuit arranged in the semiconductor memory device.

Third Embodiment

Figure 11:
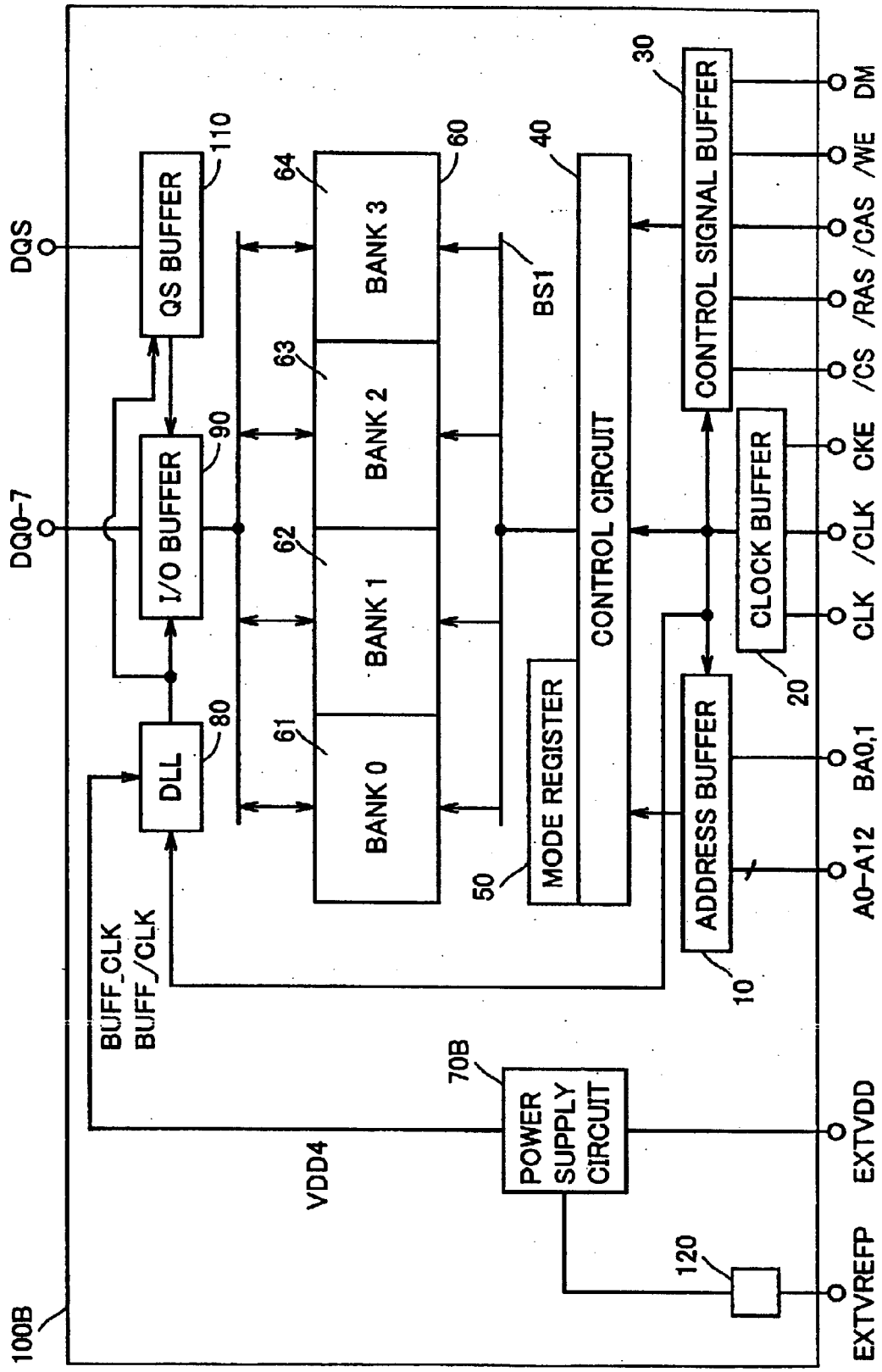
FIG. 11 is a schematic block diagram of a semiconductor memory device according to a third embodiment of the present invention.

Referring to FIG. 11, the semiconductor memory device 100B according to the third embodiment is identical to semiconductor memory device 100 except that power supply circuit 70 of semiconductor memory device 100 is replaced with a power supply circuit 70B, and a pad 120 is additionally provided.

Pad 120 externally receives a reference voltage EXTVREFP, and outputs the received reference voltage EXTVREFP to power supply circuit 70B.

Figure 12:
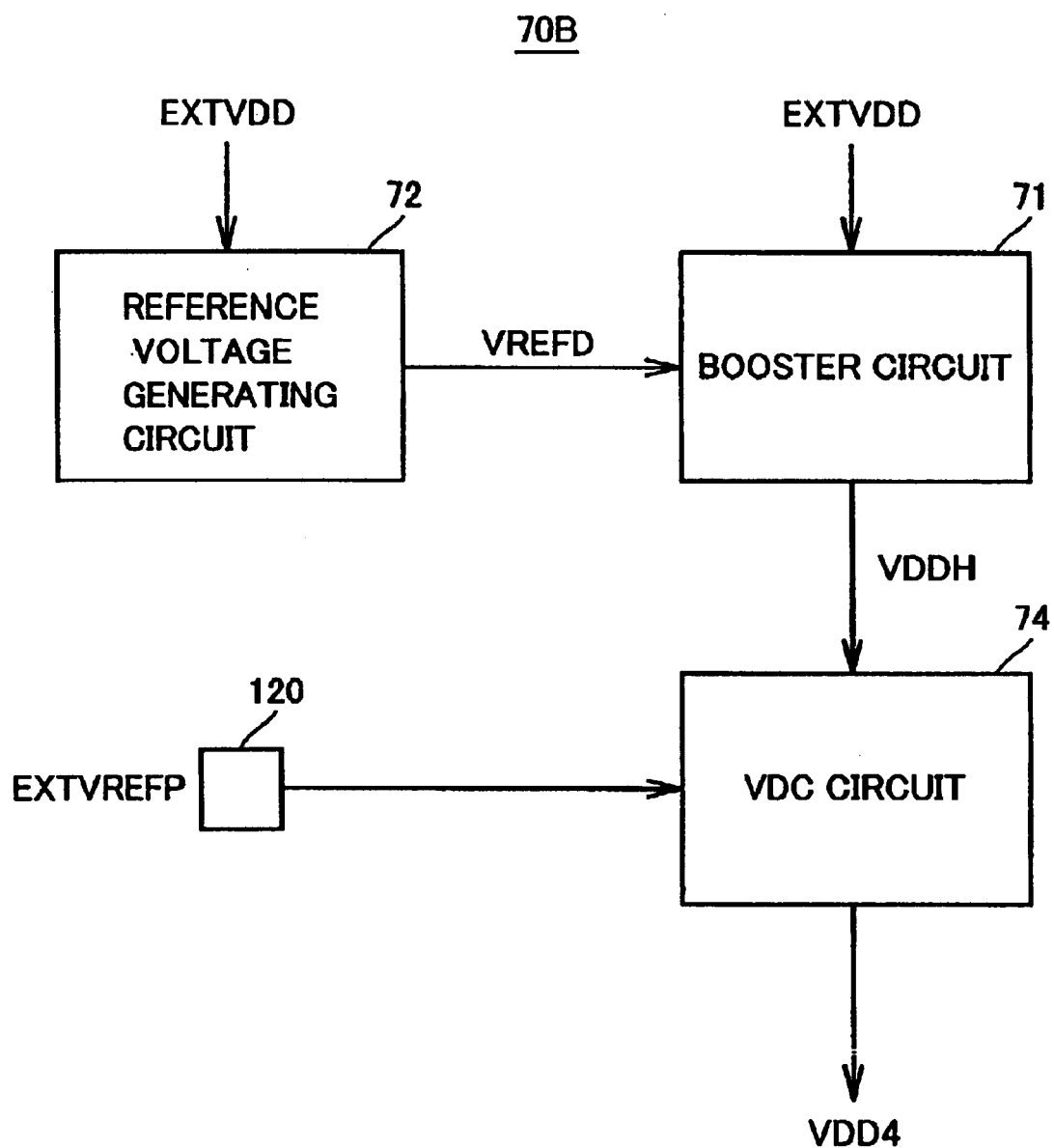
FIG. 12 is a block diagram of the power supply circuit shown in FIG. 11.

Referring to FIG. 12, power supply circuit 70B differs from power supply circuit 70 only in that reference voltage generating circuit 73 of power supply circuit 70 is eliminated. In power supply circuit 70B, VDC circuit 74 receives reference voltage EXTVREFP from pad 120.

The operation of power supply circuit 70B is now explained. The operation until booster circuit 71 generates internal power supply voltage VDDH is the same as in power supply circuit 70. When internal power supply voltage VDDH is generated, VDC circuit 74 receives internal power supply voltage VDDH from booster circuit 71, and down-converts the received internal power supply voltage VDDH to a voltage level of reference voltage EXTVREFP received from pad 120 to generate internal power supply voltage VDD4.

As such, power supply circuit 70B generates internal power supply voltage VDD4 by down-converting internal power supply voltage VDDH using externally supplied reference voltage EXTVREFP. Thus, internal power supply voltage VDD4 having a more stable voltage level can be generated based on the reference voltage EXTVREFP having a stable voltage level.

Otherwise, the third embodiment is identical to the first embodiment.

According to the third embodiment, the semiconductor memory device is provided with a power supply circuit which generates internal power supply voltage VDDH by boosting external power supply voltage EXTVDD and generates internal power supply voltage VDD4 by down-converting the generated internal power supply voltage VDDH to a voltage level lower than that of external power supply voltage EXTVDD, and is also provided with a pad externally receiving reference voltage EXTVREFP for use when down-converting internal power supply voltage VDDH. Accordingly, it is possible to generate, based on the stable reference voltage EXTVREFP, the internal power supply voltage VDD4 with a more stable voltage level.

Fourth Embodiment

Figure 13:
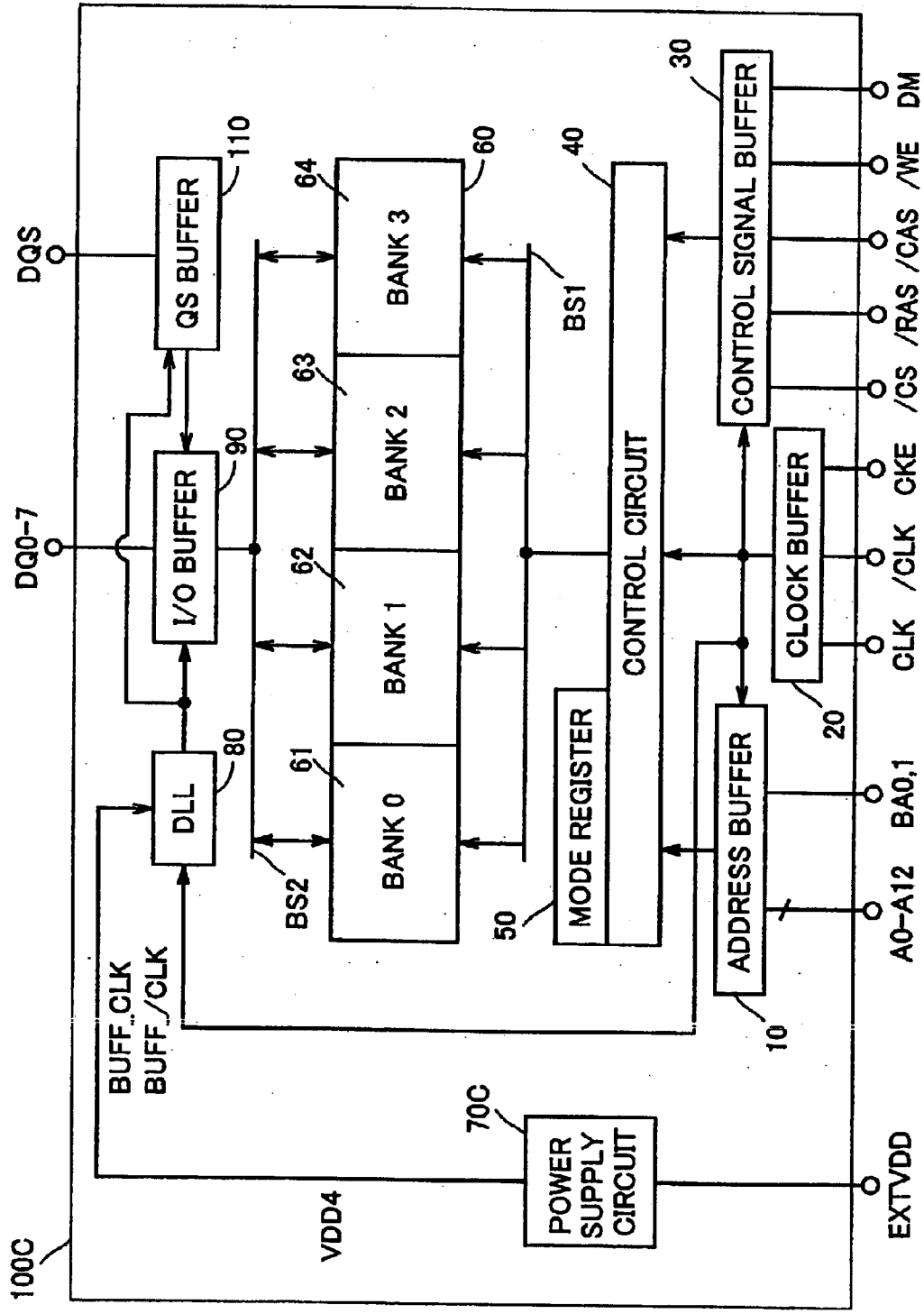
FIG. 13 is a schematic block diagram of a semiconductor memory device according to a fourth embodiment of the present invention.

Referring to FIG. 13, the semiconductor memory device 100C according to the fourth embodiment is identical to semiconductor memory device 100 except that power supply circuit 70 of semiconductor memory device 100 is replaced with a power supply circuit 70C.

Figure 14:
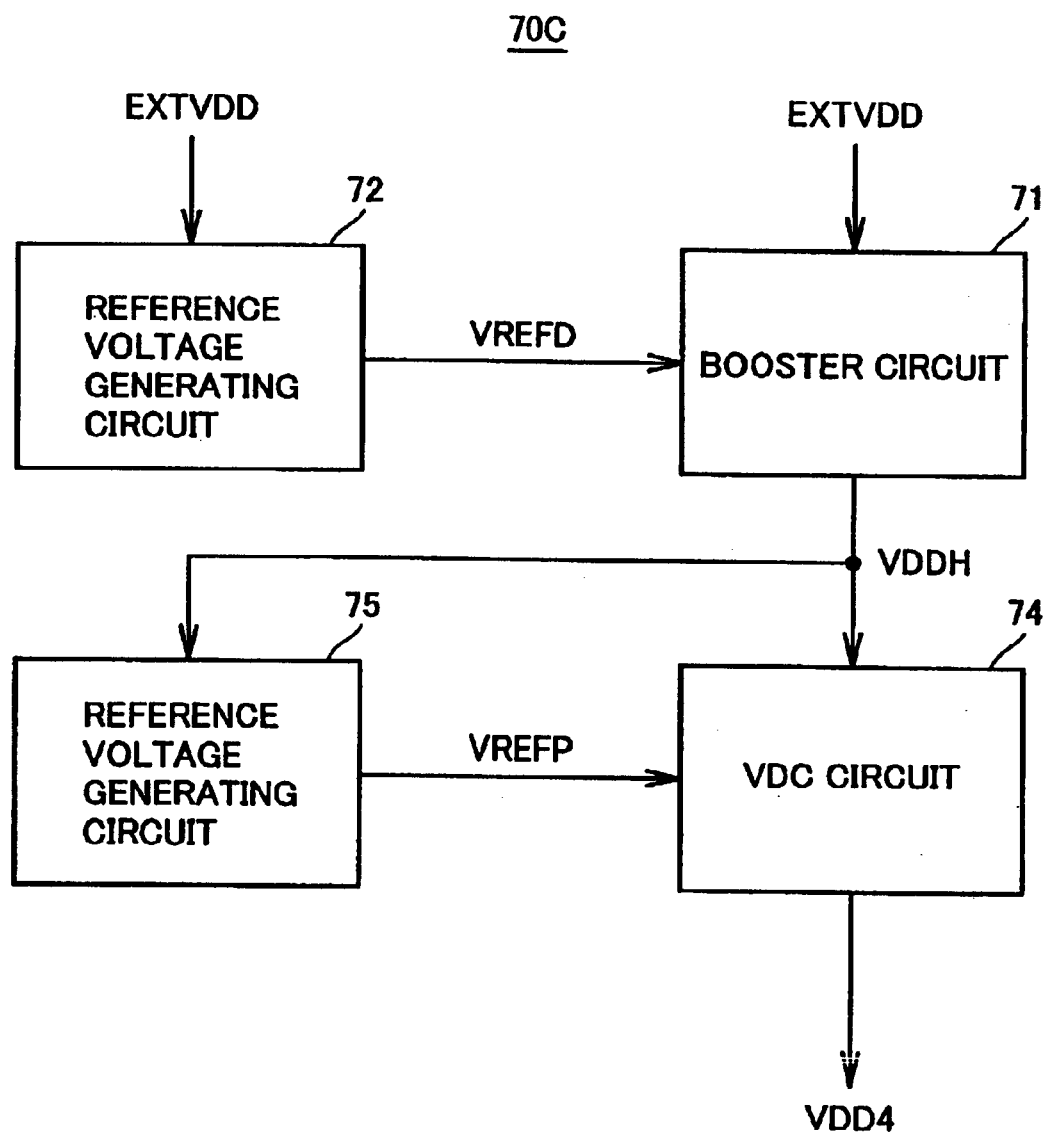
FIG. 14 is a block diagram of the power supply circuit shown in FIG. 13.

Referring to FIG. 14, power supply circuit 70C differs from power supply circuit 70 only in that reference voltage generating circuit 73 of power supply circuit 70 is replaced with a reference voltage generating circuit 75.

Reference voltage generating circuit 75 lowers a voltage level of internal power supply voltage VDDH generated by booster circuit 71, instead of that of external power supply voltage EXTVDD, to generate reference voltage VREFP, and outputs the generated reference voltage VREFP to VDC circuit 74.

Reference voltage generating circuit 75 has the same circuit configuration as reference voltage generating circuit 72 (see FIG. 5). However, when the circuit shown in FIG. 5 is adapted to reference voltage generating circuit 75, power supply node VDD1 receives internal power supply voltage VDDH generated by booster circuit 71.

Reference voltage generating circuit 75 generates reference voltage VREFP by lowering the voltage level of internal power supply voltage VDDH. Thus, compared to the case where reference voltage VREFP is generated by lowering the voltage level of external power supply voltage EXTVDD, the voltage level of reference voltage VREFP can be made more stable.

Figure 15:
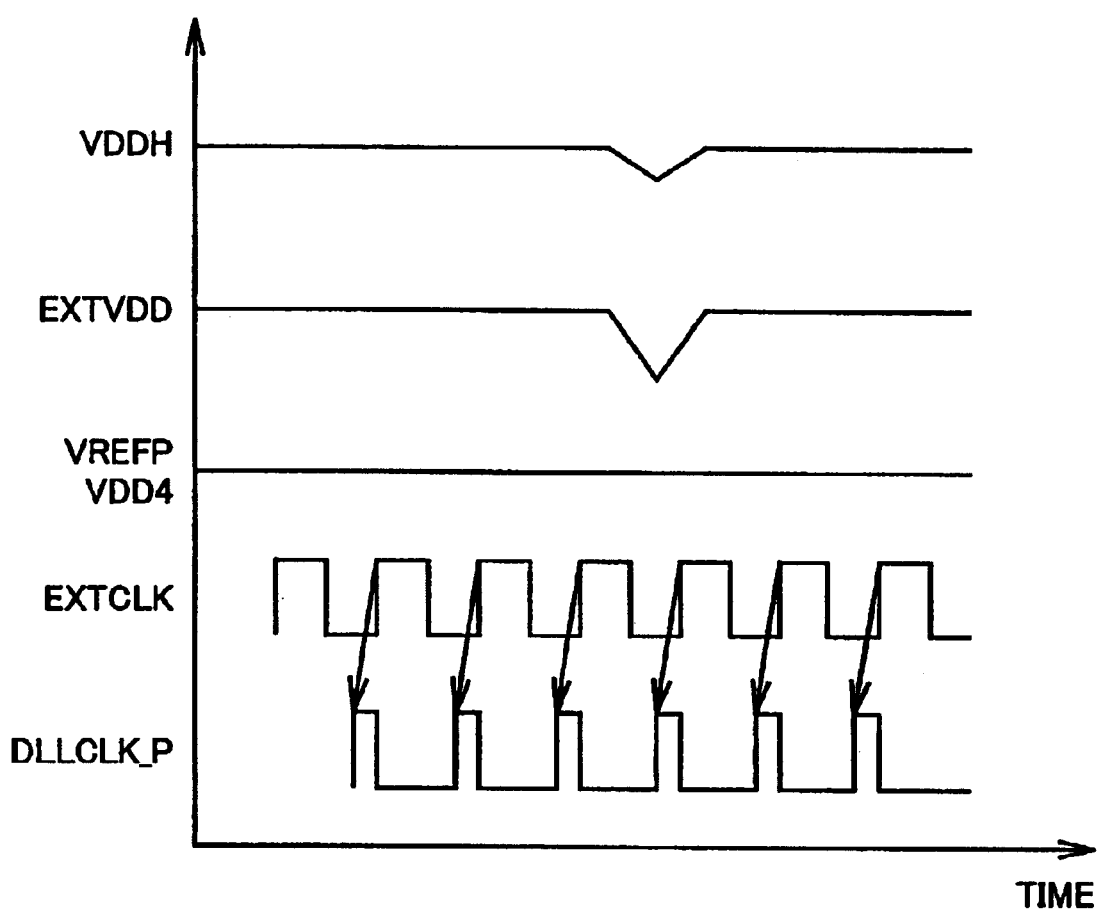
FIG. 15 is a timing chart of voltages used in the power supply circuit and signals used in the DLL shown in FIG. 13.

That is, as shown in FIG. 15, internal power supply voltage VDDH generated by boosting external power supply voltage EXTVDD has its noise level lower than that of external power supply voltage EXTVDD. Thus, the noise is hardly transmitted to the reference voltage VREFP generated by lowering the voltage level of internal power supply voltage VDDH. Accordingly, reference voltage generating circuit 75 can generate reference voltage VREFP having a more stable voltage level.

In this case, VDC circuit 74 can generate internal power supply voltage VDD4 having a still more stable voltage level based on the reference voltage VREFP having the more stable voltage level and internal power supply voltage VDDH having the decreased noise level.

In the fourth embodiment, VPP circuit 71A shown in FIG. 9 may be employed instead of booster circuit 71 shown in FIG. 14.

Otherwise, the fourth embodiment is identical to the first embodiment.

According to the fourth embodiment, the semiconductor memory device is provided with a power supply circuit which includes a booster circuit generating internal power supply voltage VDDH by boosting an external power supply voltage, a reference voltage generating circuit generating reference voltage VREFP by lowering the voltage level of internal power supply voltage VDDH, and a VDC circuit generating internal power supply voltage VDD4 by down-converting internal power supply voltage VDDH to a voltage level of reference voltage VREFP. Accordingly, an internal power supply voltage having a still more stable voltage level can be generated.

Fifth Embodiment

Figure 16:
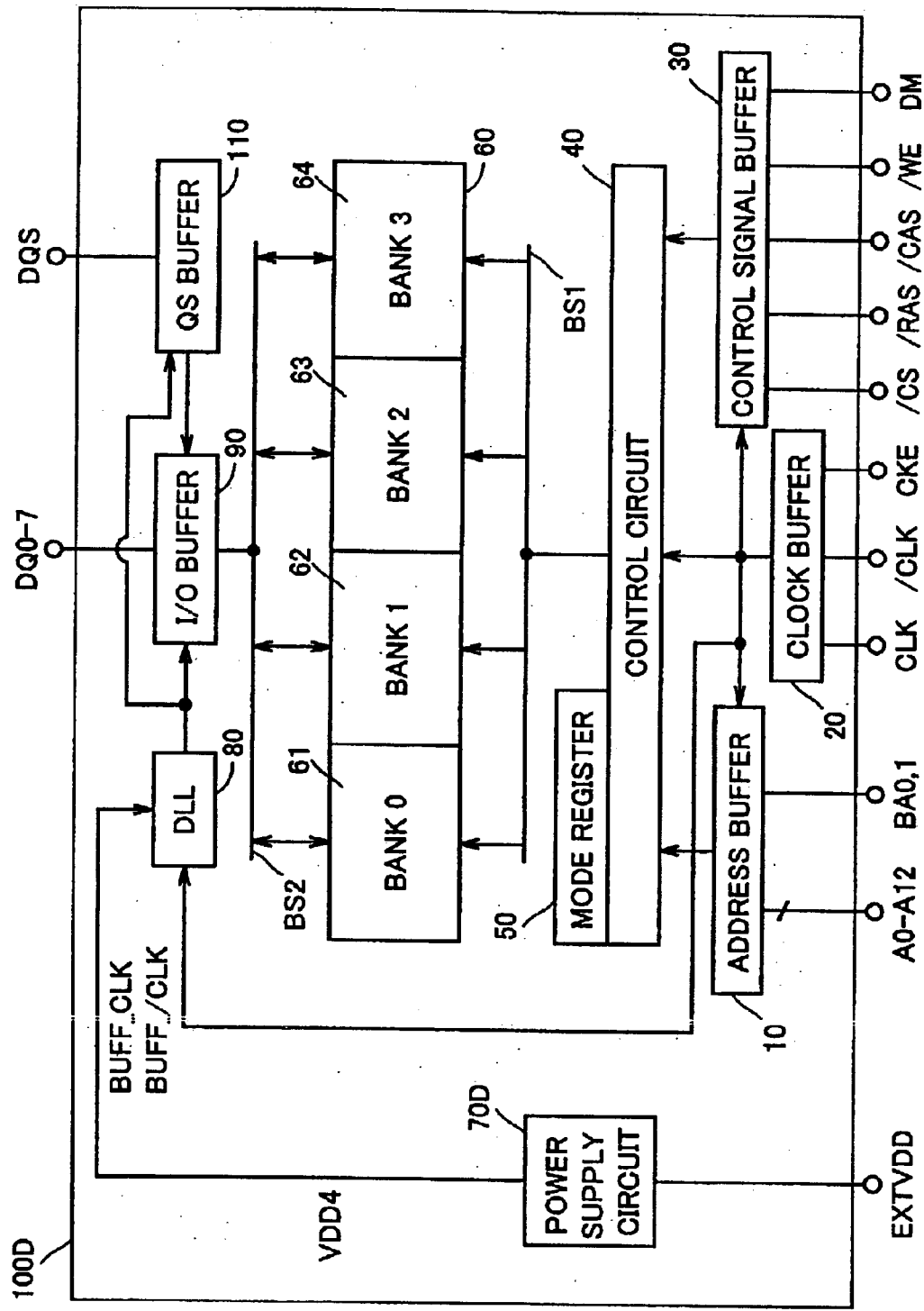
FIG. 16 is a schematic block diagram of a semiconductor memory device according to a fifth embodiment of the present invention.

Referring to FIG. 16, the semiconductor memory device 100D according to the fifth embodiment is identical to semiconductor memory device 100 except that power supply circuit 70 of semiconductor memory device 100 is replaced with a power supply circuit 70D.

Figure 17:
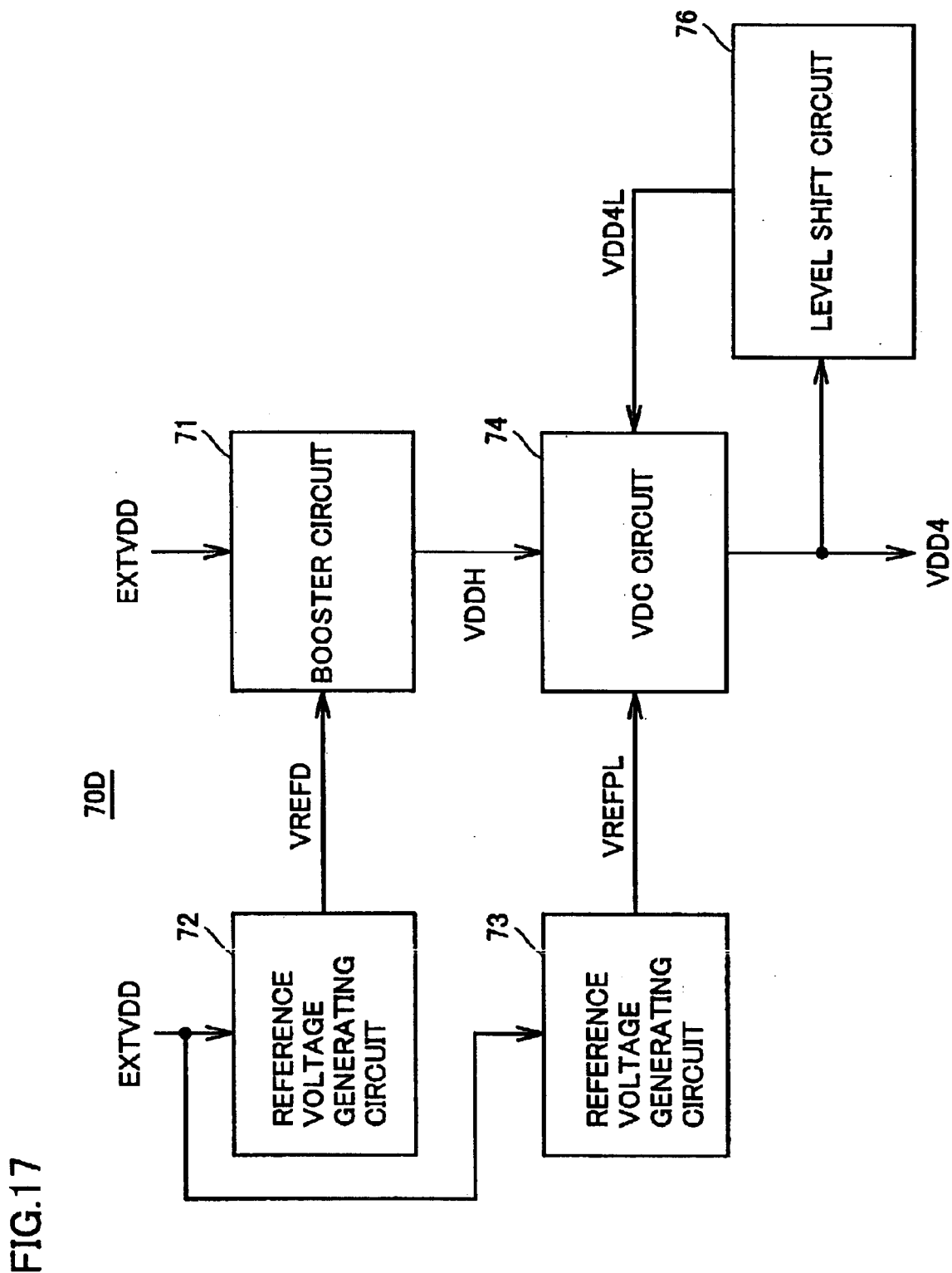
FIG. 17 is a block diagram of the power supply circuit shown in FIG. 16.

Referring to FIG. 17, power supply circuit 70D differs from power supply circuit 70 only in that a level shift circuit 76 is additionally provided. Level shift circuit 76 receives internal power supply voltage VDD4, and generates a voltage VDD4L having a voltage level lowered from that of the received internal power supply voltage VDD4, and outputs the generated voltage VDD4L to VDC circuit 74.

The reference voltage generating circuit 73 of power supply circuit 70D generates a reference voltage VREFPL having a voltage level lower than that of the reference voltage VREFP generated by reference voltage generating circuit 73 of power supply circuit 70, and outputs the generated reference voltage VREFPL to VDC circuit 74.

VDC circuit 74 of power supply circuit 70D receives voltage VDD4L from level shift circuit 76, instead of internal power supply circuit VDD4, and receives reference voltage VREFPL, instead of reference voltage VREFP. VDC circuit 74 compares voltage VDD4L with reference voltage VREFPL, and generates internal power supply voltage VDD4 by down-converting internal power supply voltage VDDH such that the voltage level of voltage VDD4L becomes equal to that of reference voltage VREFPL.

VDC circuit 74 and level shift circuit 76 constitute the power supply voltage generating circuit of the present invention.

Figure 18:
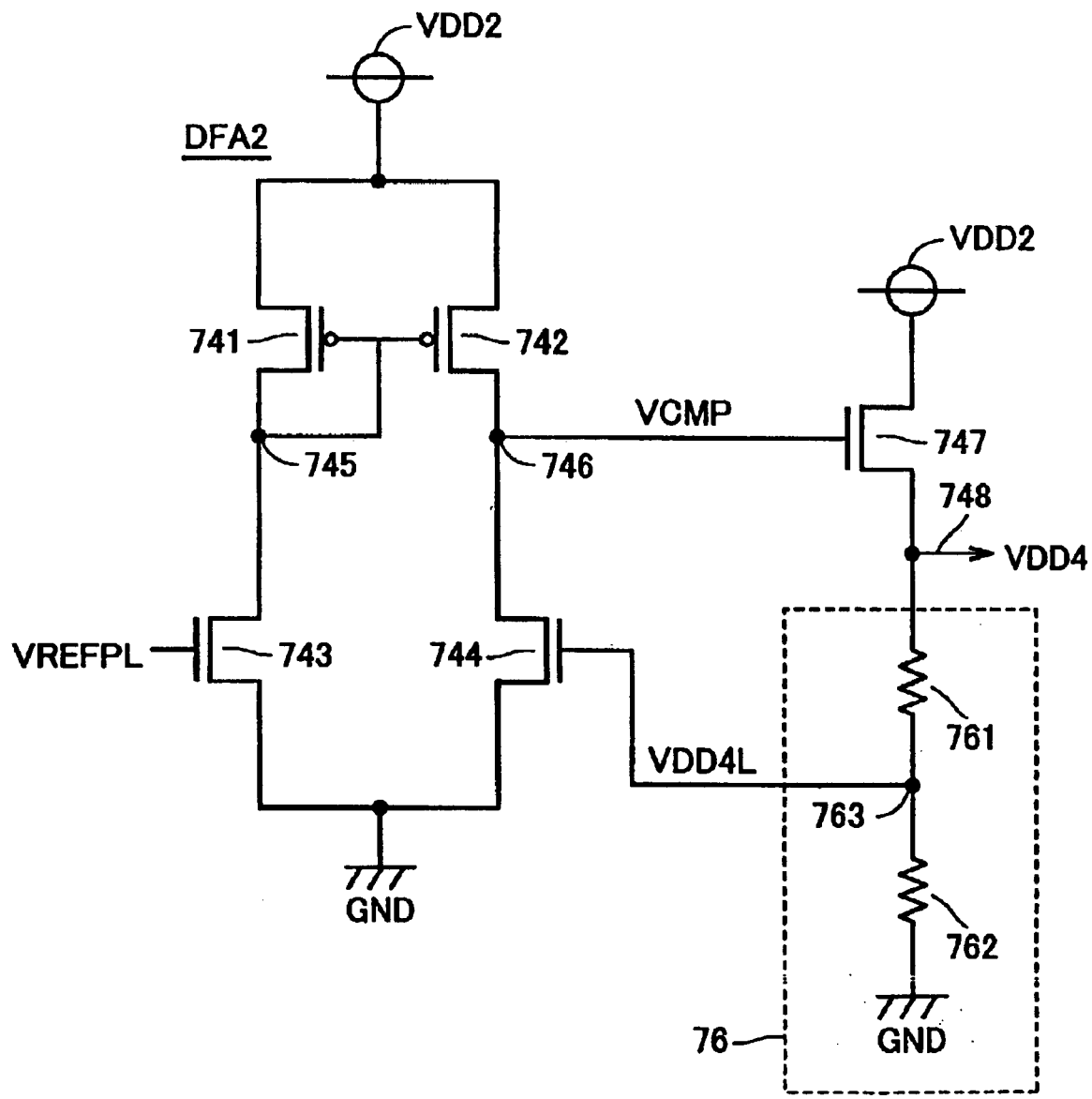
FIG. 18 is a circuit diagram of the VDC circuit and the level shift circuit shown in FIG. 17.

Referring to FIG. 18, level shift circuit 76 includes resistances 761, 762, which are connected in series between node 748 of VDC circuit 74 and a ground node GND. Internal power supply voltage VDDH is supplied to power supply node VDD2.

Level shift circuit 76 receives internal power supply voltage VDD4 on node 748, and divides the received internal power supply voltage VDD4 by resistances 761, 762, and outputs the divided voltage VDD4L from node 763 to the gate terminal of N channel MOS transistor 744 of VDC circuit 74.

Differential amplifier circuit DFA2 compares voltage VDD4L with reference voltage VREFPL, and outputs a voltage VCMP having a voltage level corresponding to the comparison result to the gate terminal of N channel MOS transistor 747. Otherwise, differential amplifier circuit DFA2 is as described above in conjunction with FIG. 6.

Figure 19:
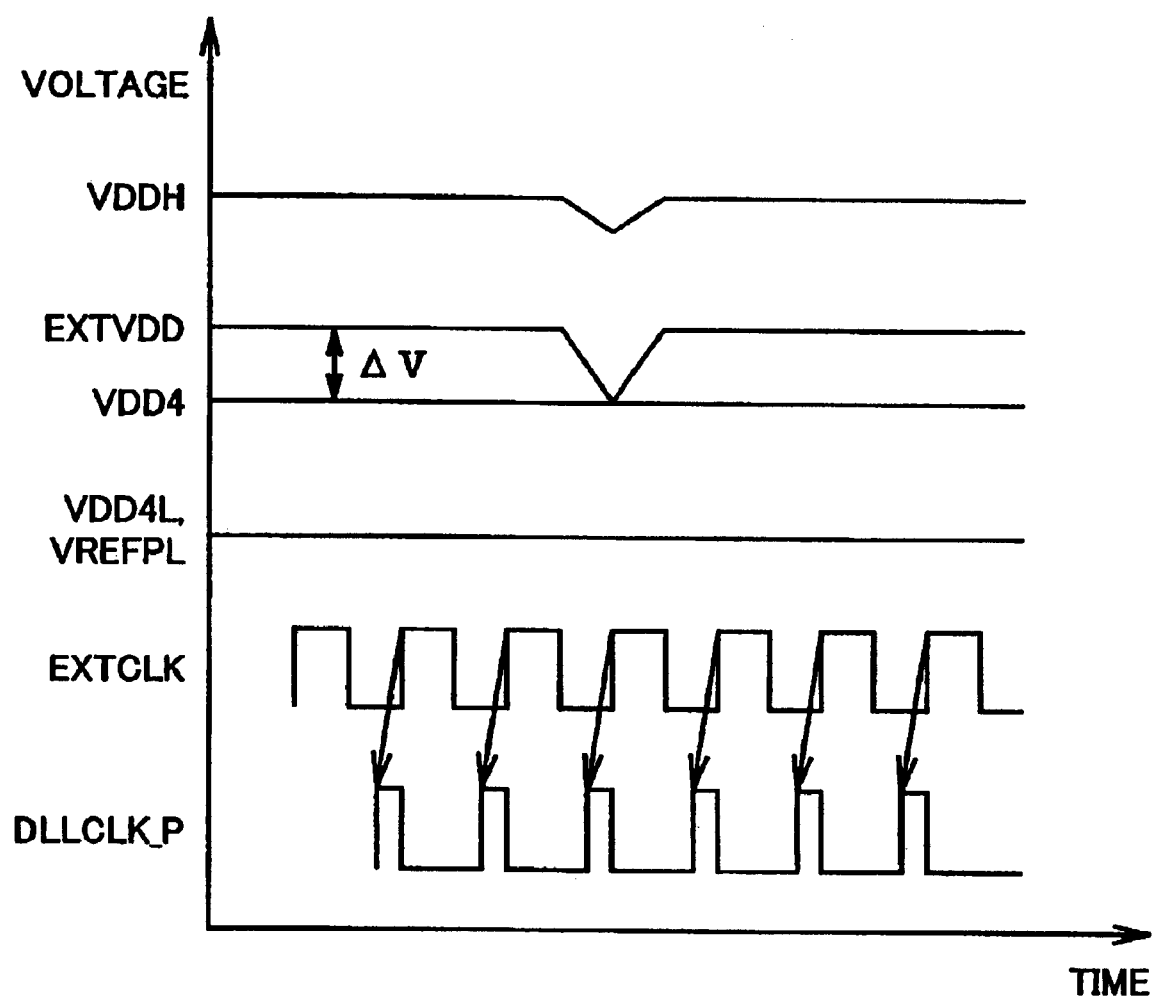
FIG. 19 is a timing chart of voltages used in the power supply circuit and signals used in the DLL shown in FIG. 16.

The operation of power supply circuit 70D is now explained with reference to FIG. 19. The operation until booster circuit 71 generates internal power supply voltage VDDH is the same as in power supply circuit 70.

Reference voltage generating circuit 73 generates reference voltage VREFPL by lowering the voltage level of external power supply voltage EXTVDD, and outputs the generated reference voltage VREFPL to VDC circuit 74. Level shift circuit 76 generates voltage VDD4L by lowering the voltage level of internal power supply voltage VDD4, and outputs the generated voltage VDD4L to VDC circuit 74.

VDC circuit 74 receives internal power supply voltage VDDH from booster circuit 71, reference voltage VREFPL from reference voltage generating circuit 73, and voltage VDD4L from level shift circuit 76. VDC circuit 74 compares voltage VDD4L with reference voltage VREFPL, and generates internal power supply voltage VDD4 by down-converting internal power supply voltage VDDH such that the voltage level of voltage VDD4L equals the voltage level of reference voltage VREFPL.

As such, VDC circuit 74 in power supply circuit 70D compares voltage VDD4L having a voltage level lower than that of internal power supply voltage VDD4 with reference voltage VREFPL having a voltage level lower than that of reference voltage VREFP. Thus, differential amplifier circuit DFA2 of power supply circuit 70D is capable of a more stable operation.

Although level shit circuit 76 is formed of two resistances 761 and 762 in the above description, the present invention is not limited thereto. Normally, level shift circuit 76 may be formed of any number of resistances more than one. Further, the operation of differential amplifier circuit DFA2 becomes more stable as the voltage level of VDD4L output from level shift circuit 76 is lower.

In the fifth embodiment, VPP circuit 71A shown in FIG. 9 may be used instead of booster circuit 71 shown in FIG. 17. Alternatively, reference voltage generating circuit 73 shown in FIG. 17 may be eliminated and reference voltage VREFPL used in VDC circuit 74 may be externally supplied via pad 120 shown in FIG. 12. Further, reference voltage generating circuit 73 shown in FIG. 17 may be replaced with reference voltage generating circuit 75 shown in FIG. 14, and reference voltage VREFPL may be generated based on internal power supply voltage VDDH or voltage VPP generated by booster circuit 71 or VPP circuit 71A.

Otherwise, the fifth embodiment is identical to the first embodiment.

According to the fifth embodiment, the semiconductor memory device is provided with a power supply circuit which includes a booster circuit generating internal power supply voltage VDDH by boosting an external power supply voltage, a reference voltage generating circuit generating reference voltage VREFPL having a voltage level lower than that of reference voltage VREFP, a level shift circuit generating voltage VDD4L by lowering the voltage level of internal power supply voltage VDD4, and a VDC circuit generating internal power supply voltage VDD4 by down-converting the internal power supply voltage VDDH such that the voltage level of voltage VDD4L equals the voltage level of reference voltage VREFPL. Accordingly, it is possible to make the VDC circuit operation more stable, and to generate internal power supply voltage VDD4 free from an influence of the noise superimposed on external power supply voltage EXTVDD.

Sixth Embodiment

Figure 20:
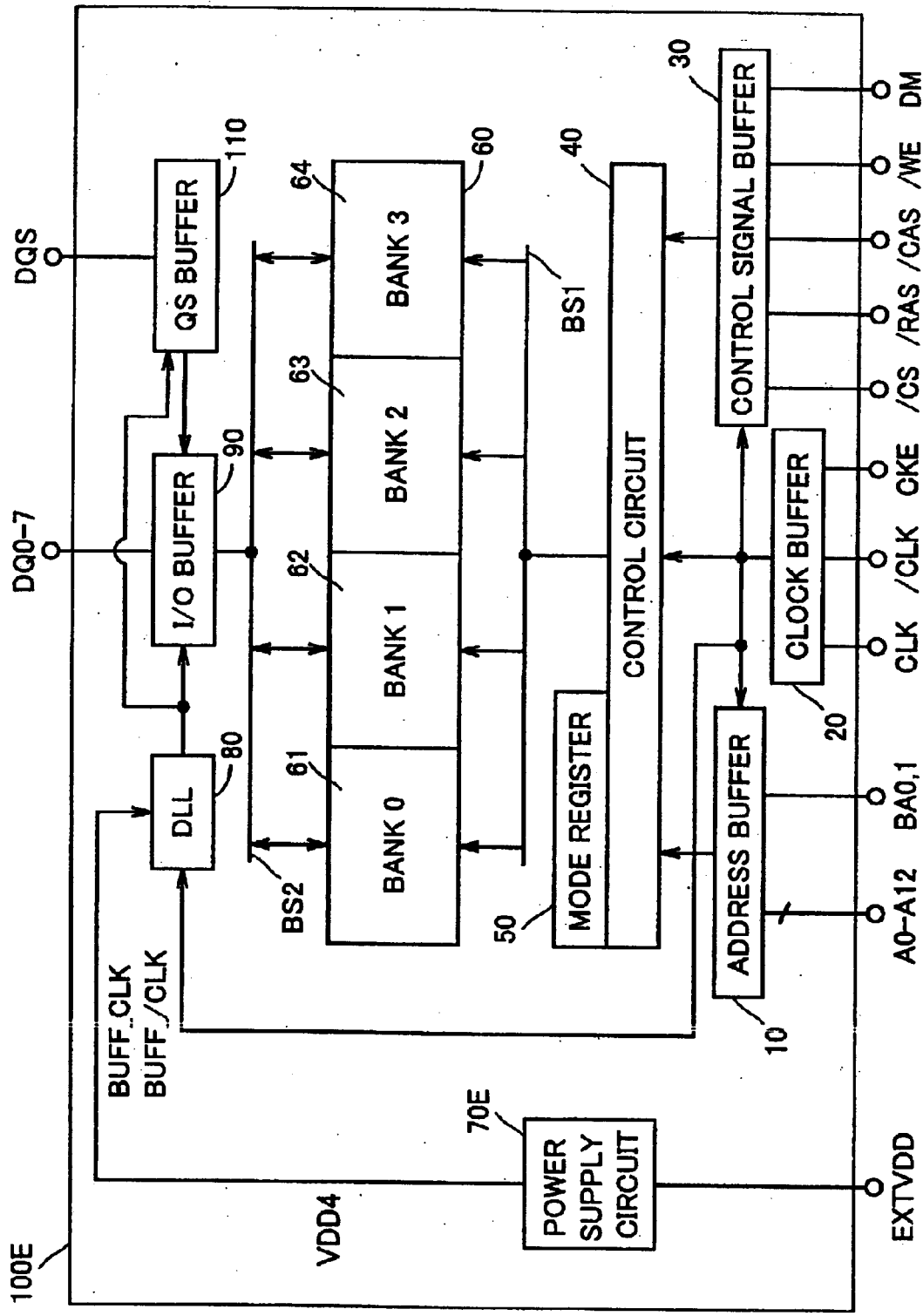
FIG. 20 is a schematic block diagram of a semiconductor memory device according to a sixth embodiment of the present invention.

Referring to FIG. 20, the semiconductor memory device 100E according to the sixth embodiment is identical to semiconductor memory device 100 except that power supply circuit 70 of semiconductor memory device 100 is replaced with a power supply circuit 70E.

Figure 21:
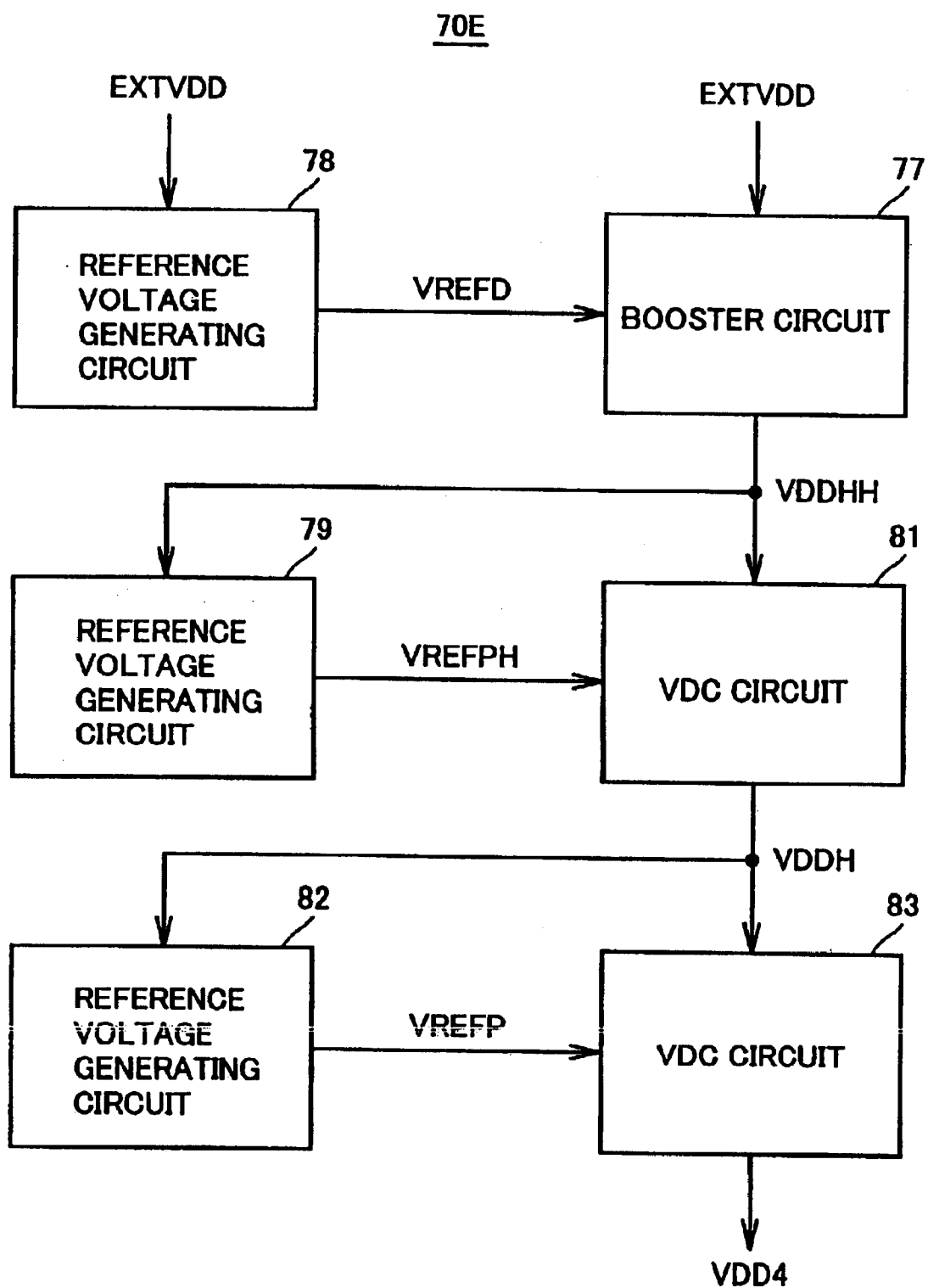
FIG. 21 is a block diagram of the power supply circuit shown in FIG. 20.

Referring to FIG. 21, power supply circuit 70E includes a booster circuit 77, reference voltage generating circuits 78, 79, 82, and VDC circuits 81, 83.

Reference voltage generating circuit 78 generates a reference voltage VREFD by lowering the voltage level of external power supply voltage EXTVDD, and outputs the generated reference voltage VREFD to booster circuit 77.

Booster circuit 77 uses reference voltage VREFD to boost external power supply voltage EXTVDD, and generates an internal power supply voltage VDDHH having a voltage level higher than that of internal power voltage VDDH. Booster circuit 77 outputs the generated internal power supply voltage VDDHH to reference voltage generating circuit 79 and VDC circuit 81.

Reference voltage generating circuit 79 receives internal power supply voltage VDDHH from booster circuit 77, and lowers the voltage level of the received internal power supply voltage VDDHH to generate reference voltage VREFPH, and outputs the generated reference voltage VREFPH to VDC circuit 81.

VDC circuit 81 down-converts internal power supply voltage VDDHH to a voltage level of reference voltage VREFPH to generate internal power supply voltage VDDH, and outputs the generated internal power supply voltage VDDH to reference voltage generating circuit 82 and VDC circuit 83.

Reference voltage generating circuit 82 receives internal power supply voltage VDDH from VDC circuit 81, and generates reference voltage VREFP having a voltage level lowered from that of the received internal power supply voltage VDDH. Reference voltage generating circuit 82 outputs the generated reference voltage VREFP to VDC circuit 83.

VDC circuit 83 down-converts internal power supply voltage VDDH from VDC circuit 81 to a voltage level of reference voltage VREFP to generate internal power supply voltage VDD4.

Booster circuit 77 has the same circuit configuration as booster circuit 71 (see FIG. 4). In this embodiment, however, power supply node VDD2 shown in FIG. 4 receives internal power supply voltage VDDHH.

Reference voltage generating circuits 78, 79, 82 each have the same circuit configuration as reference voltage generating circuit 72, 73 (see FIG. 5). When the circuit shown in FIG. 5 is adapted to reference voltage generating circuit 79, power supply node VDD1 receives internal power supply voltage VDDHH from booster circuit 77. When it is adapted to reference voltage generating circuit 82, power supply node VDD1 receives internal power supply voltage VDDH from VDC circuit 81.

VDC circuits 81, 83 each have the same circuit configuration as VDC circuit 74 (see FIG. 6). When the circuit shown in FIG. 6 is adapted to VDC circuit 81, power supply node VDD2 receives internal power supply voltage VDDHH from booster circuit 77. When it is adapted to VDC circuit 83, power supply node VDD2 receives internal power supply voltage VDDH from VDC circuit 81.

Figure 22:
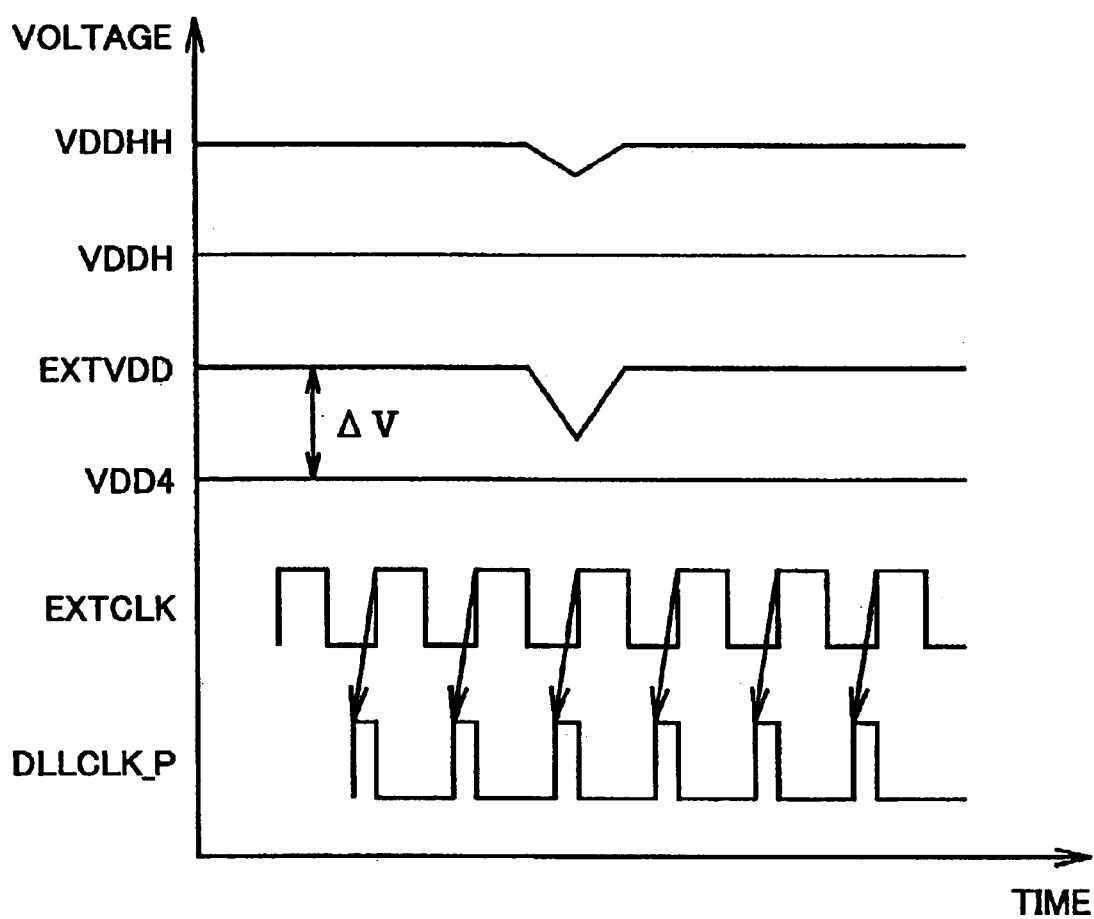
FIG. 22 is a timing chart of voltages used in the power supply circuit and signals used in the DLL shown in FIG. 20.

The operation of power supply circuit 70E is now explained with reference to FIG. 22. Reference voltage generating circuit 78 externally receives external power supply voltage EXTVDD, and lowers the voltage level of the received external power supply voltage EXTVDD to generate reference voltage VREFD. Reference voltage generating circuit 78 outputs the generated reference voltage VREFD to booster circuit 77.

In response, booster circuit 77 uses reference voltage VREFD to boost external power supply voltage EXTVDD to generate internal power supply voltage VDDHH, and outputs the generated internal power supply voltage VDDHH to reference voltage generating circuit 79 and VDC circuit 81. Reference voltage generating circuit 79 lowers the voltage level of internal power supply voltage VDDHH from booster circuit 77 to generate reference voltage VREFPH, and outputs the generated reference voltage VREFPH to VDC circuit 81.

VDC circuit 81 down-converts internal power supply voltage VDDHH from booster circuit 77 to a voltage level of reference voltage VREFPH to generate internal power supply voltage VDDH, and outputs the generated internal power supply voltage VDDH to reference voltage generating circuit 82 and VDC circuit 83. Reference voltage generating circuit 82 lowers the voltage level of internal power supply voltage VDDH from VDC circuit 81 to generate reference voltage VREFP, and outputs the generated reference voltage VREFP to VDC circuit 83.

In response, VDC circuit 83 down-converts internal power supply voltage VDDH from VDC circuit 81 to a voltage level of reference voltage VREFP to generate internal power supply voltage VDD4.

In power supply circuit 70E, reference voltage generating circuit 79 lowers the voltage level of internal power supply voltage VDDHH generated by booster circuit 77, instead of that of external power supply voltage EXTVDD, to generate reference voltage VREFPH. Similarly, reference voltage generating circuit 82 generates reference voltage VREFP by lowering the voltage level of internal power supply voltage VDDH generated by VDC circuit 81, instead of that of external power supply voltage EXTVDD.

In this case, when a noise is superimposed on external power supply voltage EXTVDD, the noise level being transmitted to internal power supply voltage VDDHH becomes lower than the noise level superimposed on external power supply voltage EXTVDD. Further, the noise superimposed on external power supply voltage EXTVDD is prevented from being transmitted to internal power supply voltage VDDH that is generated by down-converting internal power supply voltage VDDHH. Accordingly, reference voltages VREFPH, VREFP have more stable voltage levels, with the noise superimposed on external power supply voltage EXTVDD prevented from being transmitted thereto. As a result, VDC circuit 81 can generate internal power supply voltage VDDHH having a stable voltage level using reference voltage VREFPH having the stable voltage level, and VDC circuit 83 can generate internal power supply voltage VDD4 having a stable voltage level using reference voltage VREFP having the stable voltage level.

Although it has been explained above that internal power supply voltage VDDHH is generated by boosting external power supply voltage EXTVDD and internal power supply voltage VDD4 is generated by down-converting the generated internal power supply voltage VDDHH twice, the present invention is not limited thereto. Normally, the generated internal power supply voltage VDDHH may be down-converted a plurality of number of times to generate internal power supply voltage VDD4.

In such a case, power supply circuit 70E includes a plurality of reference voltage generating circuits generating a plurality of reference voltages in accordance with the number of times of down-conversion.

Otherwise, the sixth embodiment is identical to the first embodiment.

According to the sixth embodiment, the semiconductor memory device is provided with a power supply circuit which includes a booster circuit boosting an external power supply voltage to generate internal power supply voltage VDDHH, a reference voltage generating circuit lowering the voltage level of internal power supply voltage VDDHH to generate reference voltage VREFPH, a VDC circuit down-converting internal power supply voltage VDDHH to a voltage level of reference voltage VREFPH to generate internal power supply voltage VDDH, another reference voltage generating circuit lowering the voltage level of internal power supply voltage VDDH to generate reference voltage VREFP, and another VDC circuit down-converting internal power supply voltage VDDH to a voltage level of reference voltage VREFP to generate internal power supply voltage VDD4. Accordingly, it is possible to further eliminate the influence of the noise superimposed on external power supply voltage EXTVDD to generate internal power supply voltage VDD4 with a still more stable voltage level.

Seventh Embodiment

Figure 23:
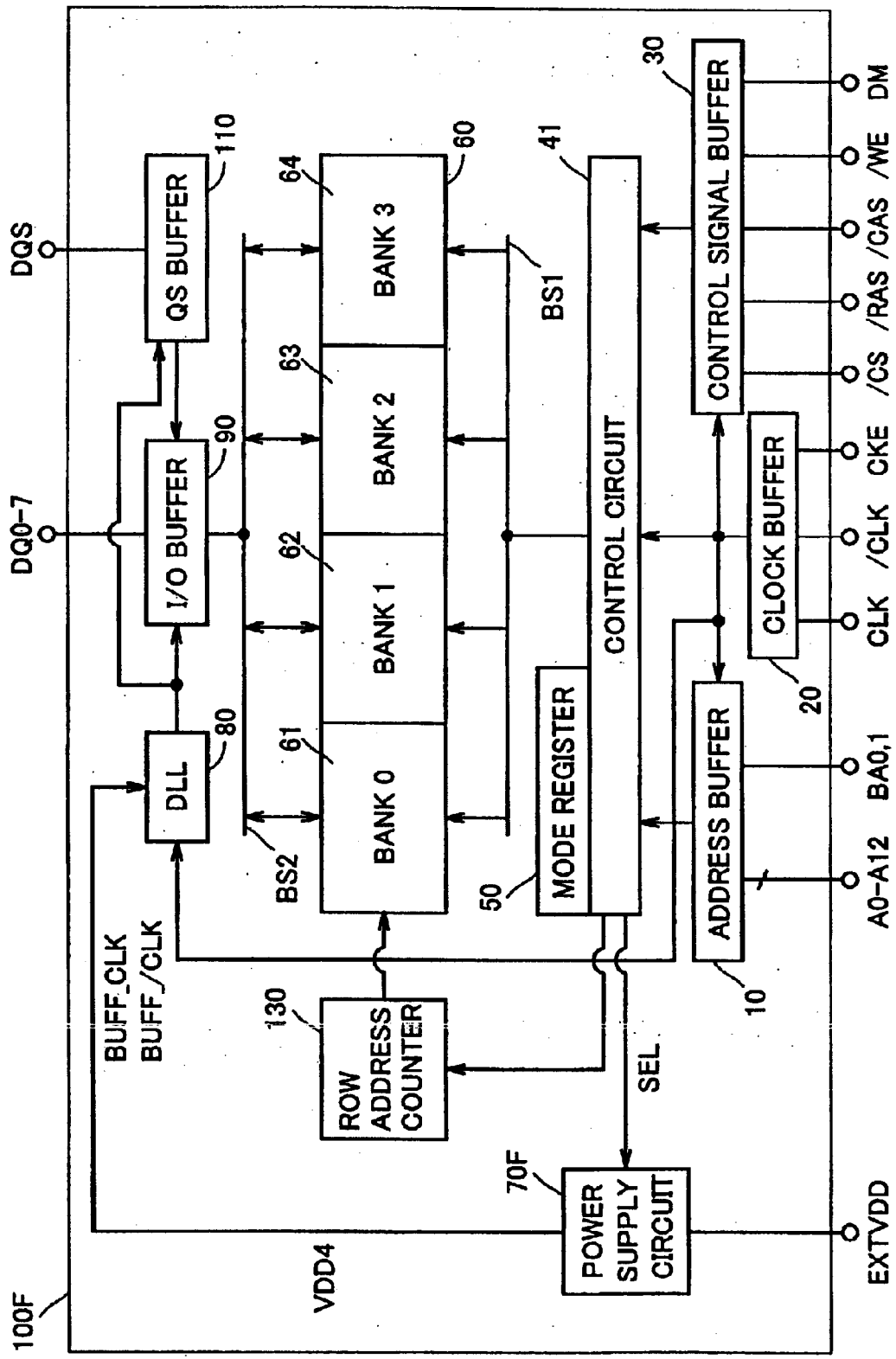
FIG. 23 is a schematic block diagram of a semiconductor memory device according to a seventh embodiment of the present invention.

Referring to FIG. 23, the semiconductor memory device 100F according to the seventh embodiment is identical to semiconductor memory device 100 except that power supply circuit 70 and control circuit 40 of semiconductor memory device 100 are replaced with a power supply circuit 70F and a control circuit 41, respectively, and that a row address counter 130 is additionally provided.

Control circuit 41 has the following function in addition to that of control circuit 40. Control circuit 41 determines a type of each of commands input to semiconductor memory device 100F based on bank addresses BA0, 1 and addresses A0–A12 received from address buffer 10, clocks BUFF_CLK, BUFF_/CLK and clock enable signal CKE received from clock buffer 20, and chip select signal /CS, row address strobe signal /RAS, column address strobe signal /CAS and write enable signal /WE received from control signal buffer 30, and outputs to power supply circuit 70F a select signal SEL having a logical level corresponding to the determined command type.

Table 1 shows the relations between the commands input to semiconductor memory device 100F and bank addresses BA0, 1, addresses select signal /CS, row address strobe signal /RAS, column address strobe signal /CAS and write enable signal /WE.

In Table 1, "H" means a logical high, and "L" means a logical low. "V" means valid, and "X" means invalid. "n" means an n-th component of clocks BUFF_CLK, BUFF_/CLK.

Thus, control circuit 41 recognizes that command ACT has been input in the case where clock enable signal CKE is at an H level at the rising of each of the (n−1)th and nth components of clock BUFF_CLK, chip select signal /CS and row address strobe signal /RAS are each at an L level, column address strobe signal /CAS and write enable signal /WE are each at an H level, and bank addresses BA0, 1 and addresses A0–A12 are all valid.

The relations between the other commands DESEL, NOP, PRE, PREA, WRITE, WRITEA, READ, READA, REFA, REFS and the logical levels of bank addresses BA0, 1, addresses A0–A12, clocks BUFF_CLK, BUFF_/CLK, clock enable signal CKE, chip select signal /CS, row address strobe signal /RAS, column address strobe signal /CAS and write enable signal /WE are as shown in Table 1.

Control circuit 41 activates row address counter 130 when self-refresh is designated, i.e., when command REFS is input. Row address counter 130, when activated by control circuit 41, counts a row address, and outputs the counted row address to all of the banks 61–64. In the self-refresh, control circuit 41 controls refresh intervals based on a built-in timer.

TABLE 1

| Command | CKE n-1 | CKE n | /CS | /RAS | /CAS | /WE | BA0, 1 | A10/ AP | A0–9, 11–12 | VREF |
|---|---|---|---|---|---|---|---|---|---|---|
| DESEL | H | X | H | X | X | X | X | X | X | VREFDL |
| NOP | H | X | L | H | H | H | X | X | X | VREFDL |
| ACT | H | H | L | L | H | H | V | V | V | VREFDH |
| PRE | H | H | L | L | H | L | V | L | X | VREFDH |
| PREA | H | H | L | L | H | L | X | H | X | VREFDH |
| WRITE | H | H | L | H | L | L | V | L | V | VREFDL |
| WRITEA | H | H | L | H | L | L | V | H | V | VREFDH |
| READ | H | H | L | H | L | H | V | L | V | VREFDH |
| READA | H | H | L | H | L | H | V | H | V | VREFDH |
| REFA | H | H | L | L | L | H | X | X | X | VREFDH |
| REFS | H | L | L | L | L | H | X | X | X | VREFDL |

Command DESEL is a command to make semiconductor memory device 100F non-selected. Command NOP is a command to cause semiconductor memory device 100F to attain a stopped state. Command ACT is a command to activate word line WLi. Command PRE is a command to lower the voltage of word line WLi to 0 V, and to cause sense amplifier 640 to stop the operation and attain a precharged state. Command PREA is a command to lower the voltage of every word line WLi included in banks 61–64 and to cause sense amplifier 640 to stop the operation and attain the precharged state.

Further, command WRITE is a command to designate writing of data to memory cell MC. Command WRITEA is a command to lower the voltage of word line WLi to 0 V after the writing operation and to cause sense amplifier 640 to stop and attain the precharged state.

Command READ is a command to designate reading of data from memory cell MC. Command READA is a command to lower the voltage of word line WLi to 0 V after the reading operation and to cause sense amplifier 640 to stop and attain the precharged state.

Further, command REFA is a command to refresh every memory cell MC included in banks 61–64. Command REFS is a command to designate self-refresh.

In the seventh embodiment, reference voltage VREF generated in power supply circuit 70F is switched to reference voltage VREFDH or VREFDL according to the type of the command input to semiconductor memory device 100F. Reference voltage VREFDH has a voltage level higher than that of reference voltage VREFDL. For example, reference voltage VREFDL is 3.0 V, while reference voltage VREFDH is 3.3 V.

Specifically, reference voltage VREFDH is selected when the current externally supplied to semiconductor memory device 100F has the current amount corresponding to that of a normal operation mode. When the current externally supplied to semiconductor memory device 100F has the current amount smaller than that of the normal operation, reference voltage VREFDL is selected.

As shown in Table 1, when each of commands DESEL, NOP, WRITE or REFS is input to semiconductor memory device 100F, control circuit 41 generates a select signal SEL of an L level for selecting reference voltage VREFDL, and outputs the select signal SEL to power supply circuit 70F. When each of commands ACT, PRE, PREA, WRITEA, READ, READA or REFA is input to semiconductor memory device 100F, control circuit 41 generates and outputs select signal SEL of an H level for selecting reference voltage VREFDH to power supply circuit 70F.

The reason why reference voltage VREFDL having a lower voltage level is selected when each of commands DESEL, NOP, WRITE or REFS is input to semiconductor memory device 100F is as follows. The current consumed in semiconductor memory device 100F when any of these commands is input is on the order of 2 mA, and the current amount externally supplied to semiconductor memory device 100F is small, and thus, even if a noise is superimposed on external power supply voltage EXTVDD, the influence of the noise will be small.

By comparison, reference voltage VREFDH having a higher voltage level is selected each of when commands ACT, PRE, PREA, WRITEA, READ, READA or REFA is input to semiconductor memory device 100F, because the current consumed in semiconductor memory device 100F when any of these commands is input is on the order of 150–300 mA, and the current amount externally supplied to semiconductor memory device 100F is large. As such, it is necessary to eliminate the influence of the noise superimposed on external power supply voltage EXTVDD.

Figure 24:
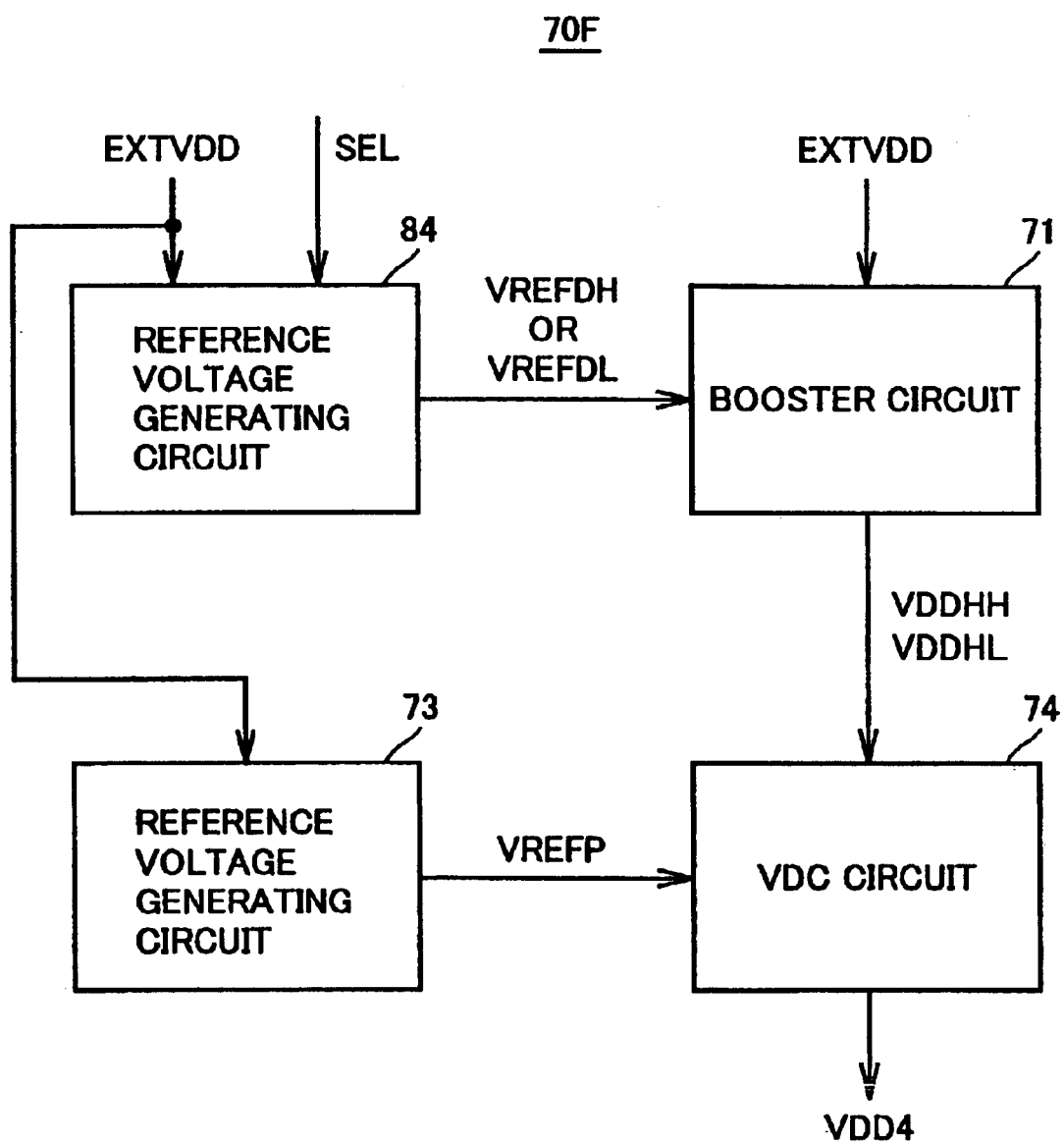
FIG. 24 is a block diagram of the power supply circuit shown in FIG. 23.

Referring to FIG. 24, power supply circuit 70F is identical to power supply circuit 70 except that reference voltage generating circuit 72 of power supply circuit 70 is replaced with a reference voltage generating circuit 84.

Reference voltage generating circuit 84 generates reference voltages VREFDH, VREFDL having voltage levels lowered from that of external power supply voltage EXTVDD externally supplied. Reference voltage generating circuit 84 selects and outputs reference voltage VREFDL to booster circuit 71 in response to select signal SEL of an L level from control circuit 41, or it selects and outputs reference voltage VREFDH to booster circuit 71 in response to select signal SEL of an H level from control circuit 41.

In power supply circuit 70F, booster circuit 71 generates internal power supply voltage VDDHH according to reference voltage VREFDH, and generates internal power supply voltage VDDHL (<VDDHH) according to reference voltage VREFDL.

VDC circuit 74 down-converts internal power supply voltages VDDHH, VDDHL from booster circuit 71 to a voltage level of reference voltage VREFP to generate internal power supply voltage VDD4. That is, VDC circuit 74 generates internal power supply voltage VDD4 of the same voltage level whether it receives internal power supply voltage VDDHH or internal power supply voltage VDDHL from booster circuit 71.

Thus, the voltage level of internal power supply voltage VDD4 becomes more stable in the case where internal power supply voltage VDD4 is generated by down-converting internal power supply voltage VDDHH than in the case where it is generated by down-converting internal power supply voltage VDDHL, because the width of down-conversion is greater in the case where internal power supply voltage VDD4 is generated based on internal power supply voltage VDDHH.

Figure 25:
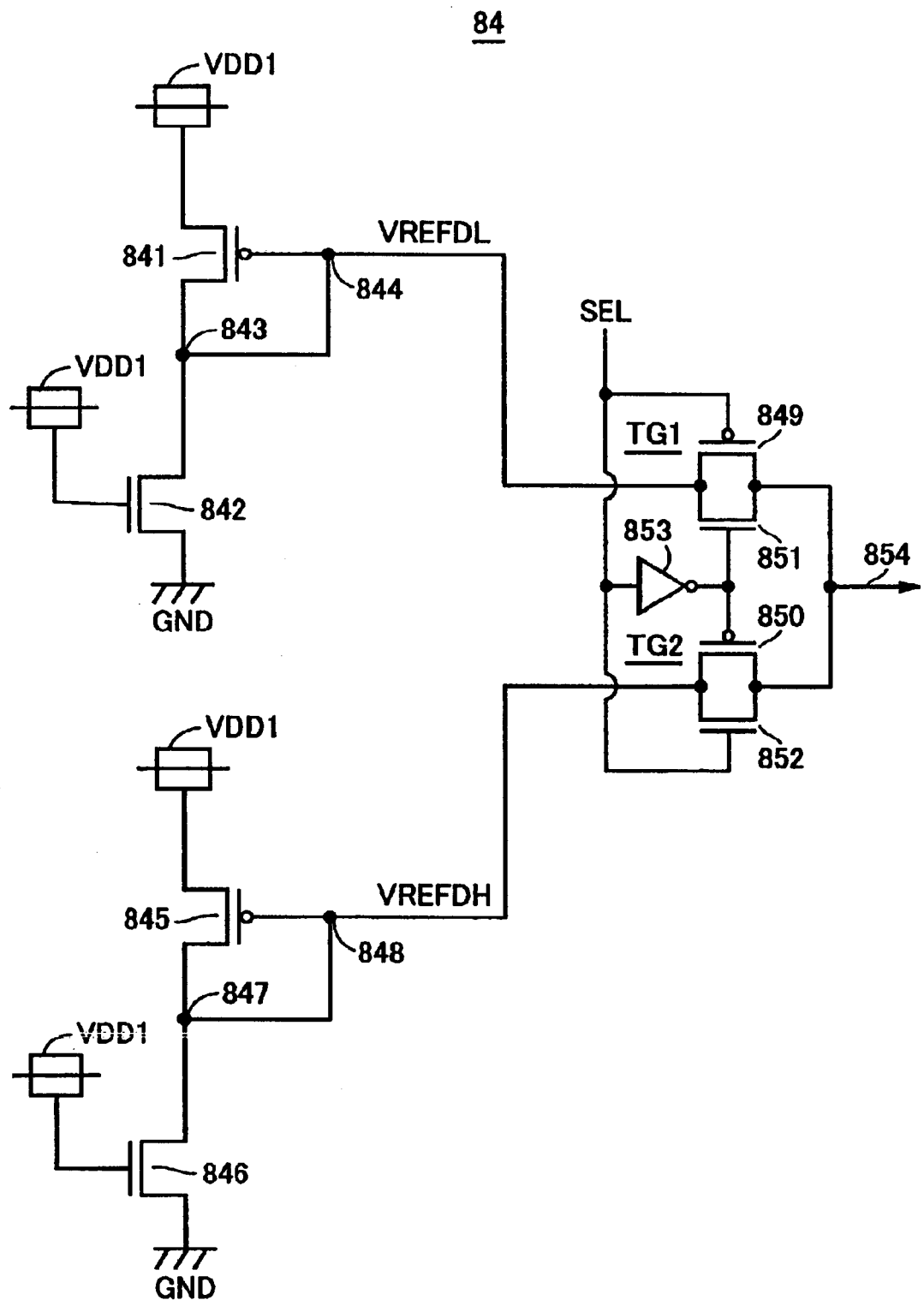
FIG. 25 is a circuit diagram of the reference voltage generating circuit shown in FIG. 24.

Referring to FIG. 25, reference voltage generating circuit 84 includes P channel MOS transistors 841, 845, 849, 850, N channel MOS transistors 842, 846, 851, 852, and an inverter 853.

P channel MOS transistor 841 and N channel MOS transistor 842 are connected in series between power supply node VDD1 and ground node GND. P channel MOS transistor 841 is diode-connected, and has its gate terminal receiving a voltage on a node 843. N channel MOS transistor 842 has its gate terminal receiving external power supply voltage EXTVDD supplied to power supply node VDD1.

P channel MOS transistor 841 and N channel MOS transistor 842 lower the voltage level of external power supply voltage EXTVDD supplied to power supply node VDD1, and outputs reference voltage VREFDL from a node 844.

P channel MOS transistor 845 and N channel MOS transistor 846 are connected in series between power supply node VDD1 and ground node GND. P channel MOS transistor 845 is diode-connected, and has its gate terminal receiving a voltage on a node 847. N channel MOS transistor 846 has its gate terminal receiving external power supply voltage EXTVDD supplied to power supply node VDD1.

P channel MOS transistor 845 and N channel MOS transistor 846 lower the voltage level of external power supply voltage EXTVDD supplied to power supply node VDD1, and outputs reference voltage VREFDH from a node 848.

The reference voltage VREFDH output by P channel MOS transistor 845 and N channel MOS transistor 846 has a voltage level higher than that of reference voltage VREFDL output by P channel MOS transistor 841 and N channel MOS transistor 842, and thus, P channel MOS transistor 845 and N channel MOS transistor 846 have the sizes greater than those of P channel MOS transistor 841 and N channel MOS transistor 842.

P channel MOS transistor 849 and N channel MOS transistor 851 constitute a transfer gate TG1, which receives reference voltage VREFDL output from node 844. P channel MOS transistor 849 has its gate terminal receiving select signal SEL from control circuit 41. N channel MOS transistor 851 has its gate terminal receiving an output signal of inverter 853.

P channel MOS transistor 850 and N channel MOS transistor 852 constitute a transfer gate TG2, which receives reference voltage VREFDH output from node 848. P channel MOS transistor 850 has its gate terminal receiving the output signal of inverter 853. N channel MOS transistor 852 has its gate terminal receiving select signal SEL from control circuit 41.

Inverter 853 inverts select signal SEL from control circuit 41 and outputs the inverted signal to the gate terminals of P channel MOS transistor 850 and N channel MOS transistor 851.

When control circuit 41 outputs select signal SEL of an L level, inverter 853 inverts the select signal SEL of the L level and outputs the signal of an H level to the gate terminals of P channel MOS transistor 850 and N channel MOS transistor 851. P channel MOS transistor 849 and N channel MOS transistor 852 receive select signal SEL of the L level.

In response, P channel MOS transistor 849 and N channel MOS transistor 851 are turned on, and P channel MOS transistor 850 and N channel MOS transistor 852 are turned off. Transfer gate TG1 outputs, to voltage generating circuit 84 outputs reference voltage VREFDL from node 854 to booster circuit 71.

When control circuit 41 outputs select signal SEL of an H level, inverter 853 inverts the select signal SEL of the H level and outputs the signal of an L level to the gate terminals of P channel MOS transistor 850 and N channel MOS transistor 851. P channel MOS transistor 849 and N channel MOS transistor 852 receive select signal SEL of the H level.

In response, P channel MOS transistor 849 and N channel MOS transistor 851 are turned off, and P channel MOS transistor 850 and N channel MOS transistor 852 are turned on. Transfer gate TG2 outputs reference voltage VREFDH output from node 848 to node 854, and reference voltage generating circuit 84 outputs reference voltage VREFDH from node 854 to booster circuit 71.

As such, reference voltage generating circuit 84 generates reference voltages VREFDL, VREFDH based on external power supply voltage EXTVDD, and selects and outputs one of reference voltages VREFDL, VREFDH to booster circuit 71 in accordance with the logical level of select signal SEL from control circuit 41.

Figure 26:
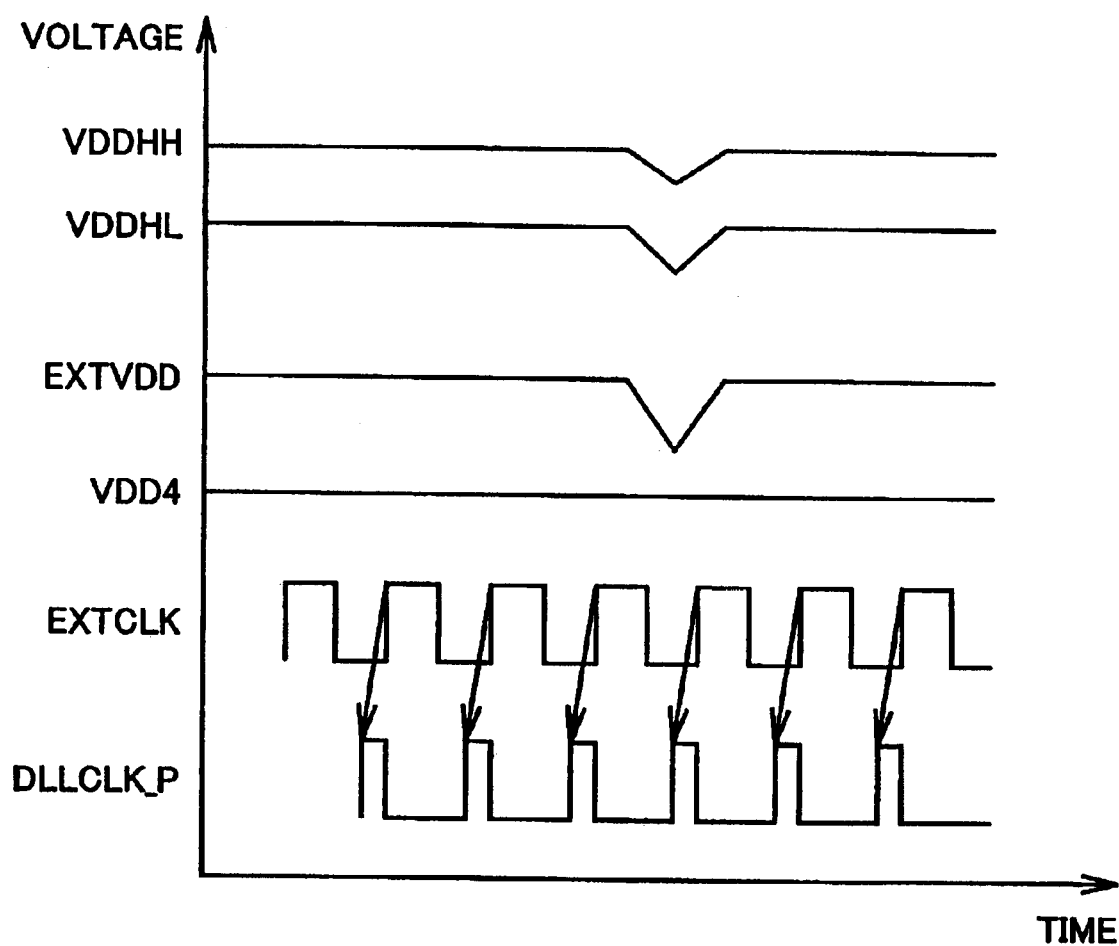
FIG. 26 is a timing chart of voltages used in the power supply circuit and signals used in the DLL shown in FIG. 23.

The operation of power supply circuit 70F is now explained with reference to FIG. 26. Reference voltage generating circuit 84 generates reference voltages VREFDL, VREFDH based on external power supply voltage EXTVDD, selects one of reference voltages VREFDL, VREFDH according to the logical level of select signal SEL from control circuit 41, and outputs the selected reference voltage VREFDL or VREFDH to booster circuit 71.

Booster circuit 71, in receipt of reference voltage VREFDL from reference voltage generating circuit 84, uses the reference voltage VREFDL to boost external power supply voltage EXTVDD, to generate internal power supply voltage VDDHL. When receiving reference voltage VREFDH from reference voltage generating circuit 84, booster circuit 71 boosts external power supply voltage EXTVDD using reference voltage VREFDH, to generate internal power supply voltage VDDHH.

Reference voltage generating circuit 73 lowers the voltage level of external power supply voltage EXTVDD to generate reference voltage VREFP, and outputs the generated reference voltage VREFP to VDC circuit 74.

In response, VDC circuit 74 down-converts internal power supply voltages VDDHL, VDDHH supplied from booster circuit 71 to a voltage level of reference voltage VREFP to generate internal power supply voltage VDD4, and outputs the generated internal power supply voltage VDD4 to DLL 80.

As such, power supply circuit 70F, when each of commands DESEL, NOP, WRITE or REFS is input to semiconductor memory device 100F, uses the reference voltage VREFDL with a lower voltage level to boost external power supply voltage EXTVDD to generate internal power supply voltage VDDHL, and down-converts the generated internal power supply voltage VDDHL to generate internal power supply voltage VDD4. When each of commands ACT, PRE, PREA, WRITEA, READ, READA or REFA is input to semiconductor memory device 100F, power supply circuit 70F uses reference voltage VREFDH with a higher voltage level to boost external power supply voltage EXTVDD to generate internal power supply voltage VDDHH, and down-converts the generated internal power supply voltage VDDHH to generate internal power supply voltage VDD4.

Thus, in the case where a large amount of current is externally supplied to semiconductor memory device 100F, DLL 80 is provided with internal power supply voltage VDD4 from which an influence of the noise superimposed on external power supply voltage EXTVDD is eliminated. As a result, it is possible to generate periodic signals DLLCLK_P, DLLCLK_N which rise at the same timing with respect to each rising timing of external clock EXTCLK.

The operation of semiconductor memory device 100F is now explained with reference to FIG. 23 again. When command DESEL is input to semiconductor memory device 100F, control circuit 41 brings semiconductor memory device 100F to a stopped state. In this case, control circuit 41 generates and outputs select signal SEL of an L level to power supply circuit 70F, and, as described above, power supply circuit 70F generates internal power supply voltage VDDHL by boosting external power supply voltage EXTVDD using reference voltage VREFDL having a lower voltage level, and generates internal power supply voltage VDD4 based on the generated internal power supply voltage VDDHL. In this case, however, DLL 80 is inactivated by control circuit 41, and thus, DLL 80 does not generate periodic signals DLLCLK_P, DLLCLK_N even if it receives internal power supply voltage VDD4.

The operation when command NOP is input to semiconductor memory device 100F is the same as in the case where command DESEL is input to semiconductor memory device 100F.

When command ACT is input to semiconductor memory device 100F, control circuit 41 generates and outputs select signal SEL of an H level to power supply circuit 70F. Power supply circuit 70F, in response to the select signal SEL of the H level, uses reference voltage VREFDH having a higher voltage level to boost external power supply voltage EXTVDD to generate internal power supply voltage VDDHH, and down-converts the generated internal power supply voltage VDDHH to generate internal power supply voltage VDD4.

DLL 80 receives internal power supply voltage VDD4 from power supply circuit 70F, and generates periodic signals DLLCLK_P, DLLCLK_N having phases corresponding to the voltage level of internal power supply voltage VDD4, and outputs the periodic signals DLLCLK_P, DLLCLK_N to I/O buffer 90 and QS buffer 110.

Control circuit 41 selects one of banks 61–64 based on bank addresses BA0, 1, and regards the input addresses A0–A12 as a row address based on row address strobe signal /RAS of an L level. Control circuit 41 outputs the row address to the selected bank (any of banks 61–64) in synchronization with clocks BUFF_CLK, BUFF_/CLK.

Row decoder 610 decodes the row address, and outputs the decoded row address to word line driver 620. Word line driver 620 activates word line WLi designated by the decoded row address. Thus, the operation when command ACT is input is completed.

When command PRE is input to semiconductor memory device 100F, semiconductor memory device 100F is performed. Word line driver 620 included in the bank (any of banks 61–64) selected when command ACT is input lowers the voltage on every word line WL1–WLn to 0 V, and control circuit 41 causes sense amplifier 640 to stop the operation. Thus, the operation when command PRE is input to semiconductor memory device 100F is completed.

When command PREA is input to semiconductor memory device 100F, control circuit 41 generates and outputs select signal SEL of an H level to power supply circuit 70F. Power supply circuit 70F and DLL 80 perform the same operations as in the case where command ACT is input. Control circuit 41 selects all of the banks 61–64, and word line driver 620 included in each bank 61–64 lowers the voltage on every word line WL1–WLn to 0 V. Control circuit 41 terminates the operation of sense amplifier 640 included in each of banks 61–64. Thus, the operation when command PREA is input is completed.

When command WRITE is input to semiconductor memory device 100F, control circuit 41 generates and outputs select signal SEL of an L level to power supply circuit 70F. Power supply circuit 70F and DLL 80 perform the same operations as in the case where command DESEL is input.

The operation with which write data is written into memory cell MC is as described in the first embodiment.

When command WRITEA is input to semiconductor memory device 100F, control circuit 41 generates and outputs select signal SEL of an H level to power supply circuit 70F. Power supply circuit 70F and DLL 80 perform the same operations as in the case where command ACT is input. Control circuit 41 selects a bank (any of banks 61–64) to which data is to be written.

Word line driver 620 included in the selected bank lowers the voltage on every word line WL1–WLn to 0 V, and control circuit 41 terminates the operation of sense amplifier 640. Thus, the operation when command WRITEA is input to semiconductor memory device 100F is completed.

When command READ is input to semiconductor memory device 100F, control circuit 41 generates and outputs select signal SEL of an H level to power supply circuit 70F. Power supply circuit 70F and DLL 80 operate in the same manner as in the case where command ACT is input. The operation of reading data from memory cell MC and outputting the read data to the outside of semiconductor memory device 100F is as described in the first embodiment.

When command READA is input to semiconductor memory device 100F, control circuit 41 generates and outputs select signal SEL of an H level to power supply circuit 70F. Power supply circuit 70F and DLL 80 operate in the same manner as in the case where command ACT is input. Control circuit 41 selects a bank (any of banks 61–64) from which data is to be read.

Word line driver 620 included in the selected bank lowers the voltage on every word line WL1–WLn to 0 V, and control circuit 41 terminates the operation of sense amplifier 640. Thus, the operation when command READA is input to semiconductor memory device 100F is completed.

When command REFA is input to semiconductor memory device 100F, control circuit 41 generates and outputs select signal SEL of an H level to power supply circuit 70F. Power supply circuit 70F and DLL 80 perform the same operations as in the case where command ACT is input. Control circuit 41 selects all of the banks 61–64, and all of the memory cells MC included in banks 61–64 are refreshed.

When command REFS is input to semiconductor memory device 100F, control circuit 41 generates and outputs select signal SEL of an L level to power supply circuit 70F. Power supply circuit 70F and DLL 80 perform the same operations as in the case where command DESEL is input. Control circuit 41 activates row address counter 130, and row address counter 130 counts the row address, and outputs the counted row address to all of the banks 61–64.

In response, row decoder 610 included in each of banks 61–64 decodes the row address from row address counter 130, and outputs the decoded row address to corresponding word line driver 620. Word line driver 620 activates word line WLi designated by the decoded row address, and memory cells MC connected to the activated word line WLi are refreshed.

Row address counter 130 outputs the counted row addresses sequentially to the row decoders 610 of banks 61–64, and all of the word lines WL1–WLn included in banks 61–64 are activated and all of the memory cells are refreshed. Thus, the operation when command REFS is input is completed.

Although it has been described above that reference voltage generating circuit 84 generates two types of reference voltages with respect to a variety of commands, the present invention is not limited thereto. More than two types of reference voltages may be generated in accordance with the types of commands, and among the plurality of reference voltages generated, a reference voltage corresponding to the type of the command may be selected to boost the external power supply voltage. For example, while the current consumed in semiconductor memory device 100F when each of commands ACT, PRE, PREA, WRITEA, READ, READA or REFA is input thereto is on the order of 150–300 mA, the voltage levels of the reference voltages may be further changed in accordance with the consumed current amount, to boost the external power supply voltage.

Further, the power supply circuit in semiconductor memory device 100F may be configured by adapting any of the second through sixth embodiments described above.

Otherwise, the seventh embodiment is identical to the first embodiment.

According to the seventh embodiment, the semiconductor memory device is provided with a power supply circuit which generates internal power supply voltages VDDHL and VDD4 in accordance with a type of the input command. Specifically, in a mode where a small amount of current is externally supplied, the power supply circuit boosts external power supply voltage EXTVDD using a reference voltage with a reduced voltage level to generate internal power supply voltage VDDHL, and down-converts the generated internal power supply voltage VDDHL to generate internal power supply voltage VDD4. In a mode where a large amount of current is externally supplied, the power supply circuit boosts external power supply voltage EXTVDD using a reference voltage with an increased voltage level to generate internal power supply voltage VDDHH, and down-converts the generated internal power supply voltage VDDHH to generate internal power supply voltage VDD4. Accordingly, the influence of the noise superimposed on external power supply voltage EXTVDD can be eliminated efficiently.

As a result, it is possible to generate a periodic signal which rises at constant timings with respect to the rising timings of the external clock.

Although it has been described that internal power supply voltage VDDH (or VDDHH, VDDLH) is generated by boosting external power supply voltage EXTVDD and that internal power supply voltage VDD4 is generated by down-converting the generated internal power supply voltage VDDH (or VDDHH, VDDHL), the present invention is not limited thereto. Internal power supply voltage VDD4 may be generated by down-converting external power supply voltage EXTVDD and then boosting the down-converted voltage.

In the present invention, internal power supply voltage VDD4 may be generated by down-converting external power supply voltage EXTVDD a plurality of number of times. By doing so, it is possible to make the voltage level of internal power supply voltage VDD4 more stable than in the conventional case.

Figure 27:
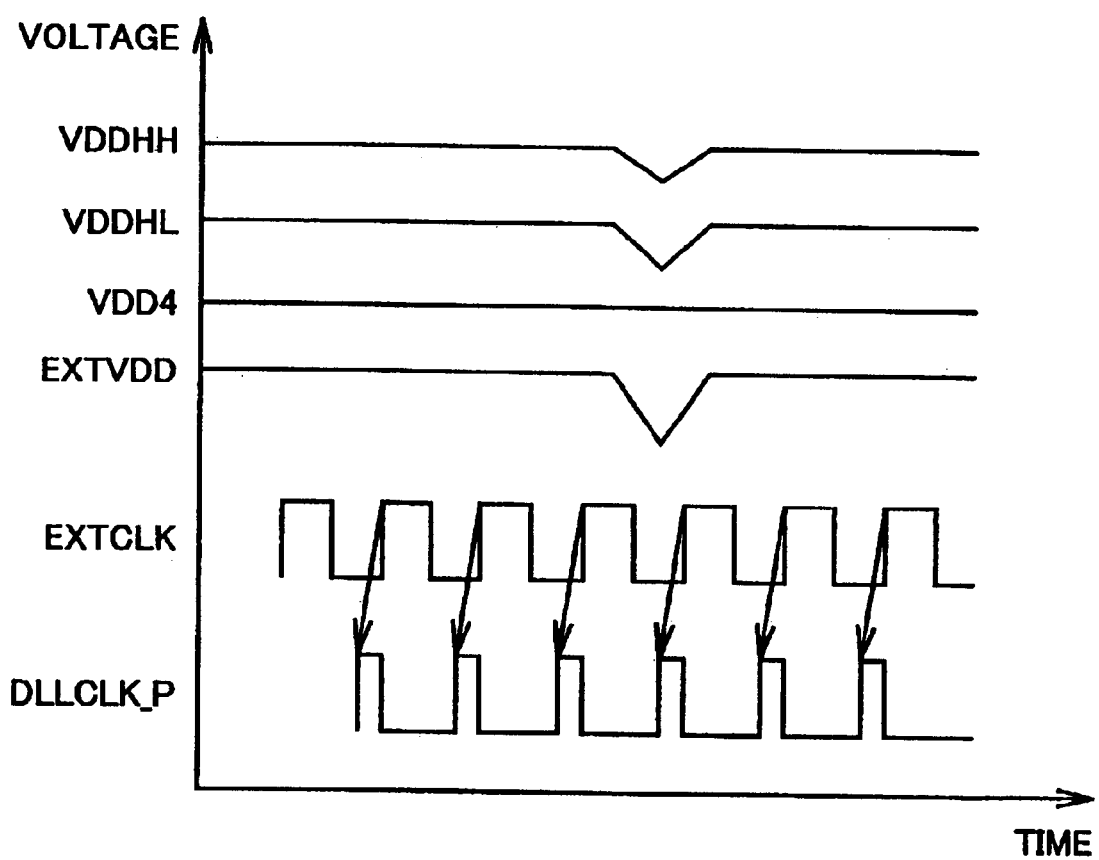
FIG. 27 is a timing chart of voltages used in the power supply circuit and signals used in the DLL of the present invention.
Figure 28:
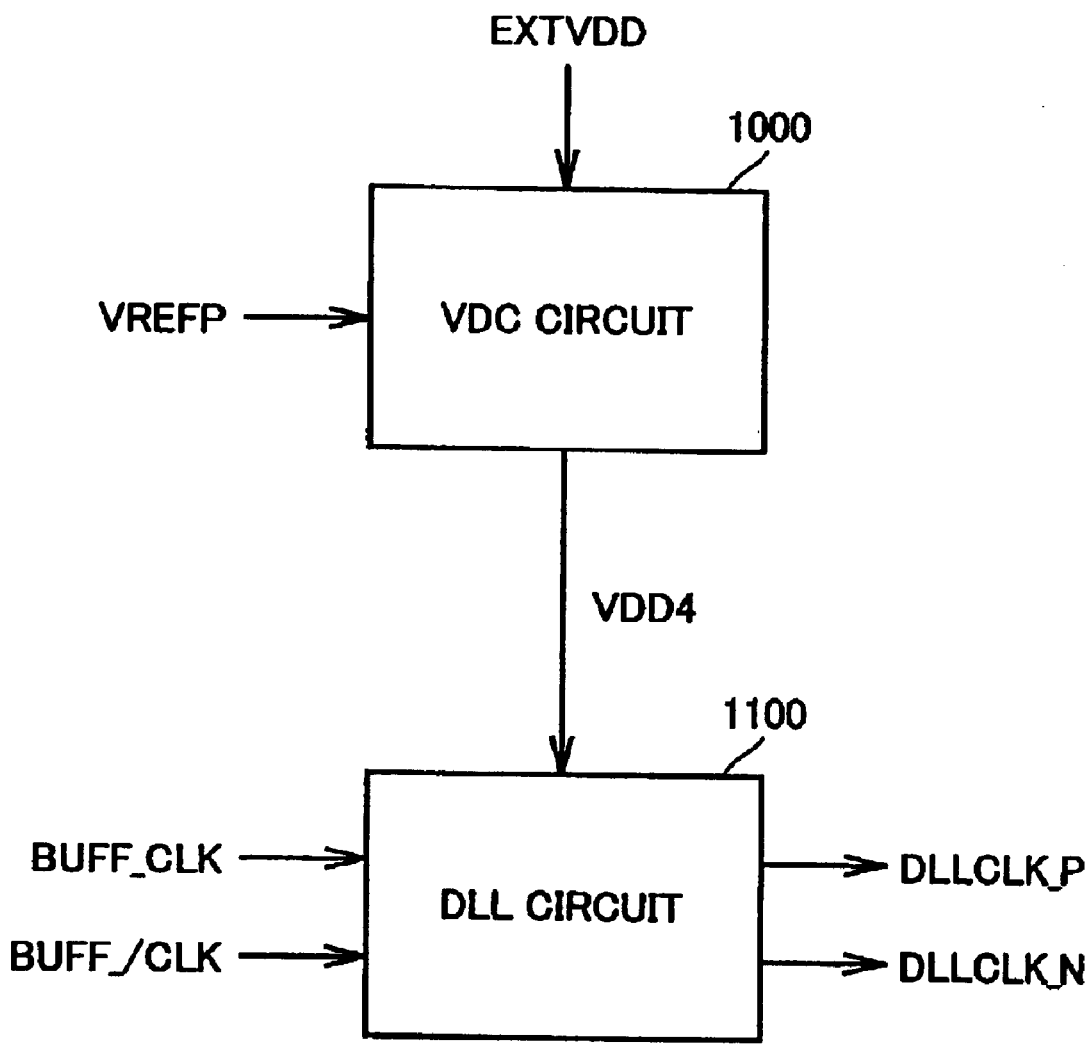
FIG. 28 is a block diagram of a VDC circuit and a DLL circuit mounted in a conventional DDR-SDRAM.
Figure 29:
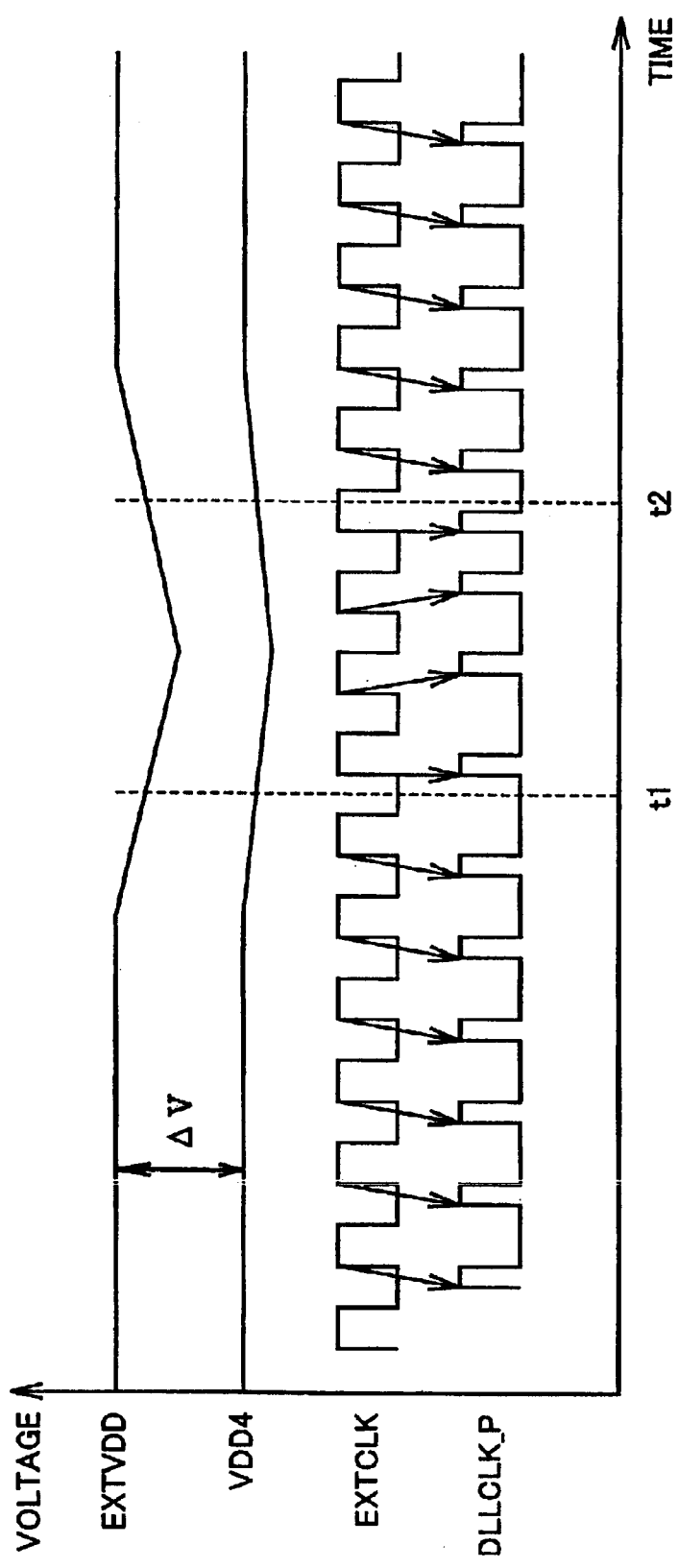
FIG. 29 is a timing chart of voltages and signals illustrating a problem of the conventional device.

Further, as shown in FIG. 27, the voltage level of internal power supply voltage VDD4 is higher than the voltage level of external power supply voltage EXTVDD. As such, generating internal power supply voltage VDD4 having a voltage level higher than that of external power supply voltage EXTVDD by boosting the external power supply voltage EXTVDD and then down-converting the boosted voltage makes it possible to generate internal power supply voltage VDD4 having a more stable voltage level and less likely to suffer the influence of the noise superimposed on external power supply voltage EXTVDD, compared to the case where internal power supply voltage VDD4 is generated by boosting external power supply voltage EXTVDD only once. In addition, the phases of periodic signals DLLCLK_P, DLLCLK_N generated by DLL 80 can be adjusted minutely, as the DLL 80 is provided with the internal power supply voltage VDD4 having a voltage level higher than that of external power supply voltage EXTVDD.

Further, the driver transistor (N channel MOS transistor 747) shown in FIGS. 6 and 18 is preferably formed of a P channel MOS transistor.

Still further, although the DDR-SDRAM has been taken as an example in the above description, the present invention is not limited thereto, but is also applicable to a flash memory and an SRAM (Static Random Access Memory) which input/output data in synchronization with periodic signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
    a memory cell array storing data;
    a power supply circuit changing a voltage level of an external power supply voltage to generate a first internal power supply voltage and changing a voltage level of the generated first internal power supply voltage to generate a second internal power supply voltage;
    a periodic signal generating circuit generating a periodic signal having a phase corresponding to a voltage level of said second internal power supply voltage supplied from said power supply circuit; and
    an output circuit externally outputting read data read out from said memory cell array, in synchronization with said periodic signal.

2. The semiconductor memory device according to claim 1, wherein said power supply circuit boosts said external power supply voltage to generate said first internal power supply voltage, and down-converts the generated first internal power supply voltage to generate said second internal power supply voltage.

3. The semiconductor memory device according to claim 2, further comprising a word line driver selectively activating a word line included in said memory cell array, wherein
    said power supply circuit includes
        a boosted voltage generating circuit boosting said external power supply voltage to generate said first internal power supply voltage as a boosted voltage for activating said word line and
        a down converter circuit down-converting said first internal power supply voltage to generate said second internal power supply voltage, and
    said boosted voltage generating circuit supplies said generated first internal power supply voltage to said word line driver and to said down converter circuit.

4. The semiconductor memory device according to claim 3, further comprising a pad externally receiving a reference voltage, wherein
    said down converter circuit down-converts said first internal power supply voltage to a voltage level of the reference voltage supplied from said pad to generate said second internal power supply voltage.

5. The semiconductor memory device according to claim 2, wherein said power supply circuit generates a reference voltage based on said first internal power supply voltage, and down-converts said first internal power supply voltage to a voltage level of said reference voltage to generate said second internal power supply voltage.

6. The semiconductor memory device according to claim 5, wherein
    said power supply circuit includes
        a booster circuit boosting said external power supply voltage to generate said first internal power supply voltage,
        a reference voltage generating circuit down-converting said first internal power supply voltage to generate said reference voltage, and
        a down converter circuit down-converting said first internal power supply voltage supplied from said booster circuit to a voltage level of the reference voltage supplied from said reference voltage generating circuit to generate said second internal power supply voltage.

7. The semiconductor memory device according to claim 2, wherein
    said power supply circuit includes
        a booster circuit boosting said external power supply voltage to generate said first internal power supply voltage,
        a reference voltage generating circuit generating a reference voltage, and
        a power supply voltage generating circuit generating a third internal power supply voltage having a voltage level lower than the voltage level of said second internal power supply voltage, and generating said second internal power supply voltage by down-converting said first internal power supply voltage from said booster circuit such that the voltage level of the generated third internal power supply voltage becomes equal to a voltage level of said reference voltage.

8. The semiconductor memory device according to claim 7, wherein
    said power supply voltage generating circuit includes
        a level shift circuit down-converting said second internal power supply voltage to generate the third internal power supply voltage, and
        a down converter circuit comparing said third internal power supply voltage with said reference voltage, and generating said second internal power supply voltage by down-converting said first internal power supply voltage such that said third internal power supply voltage becomes equal to said reference voltage.

9. The semiconductor memory device according to claim 2, wherein said power supply circuit boosts said external power supply voltage to generate a third internal power supply voltage having a voltage level higher than the voltage level of said first internal power supply voltage, and down-converts the generated third internal power supply voltage a plurality of number of times to generate said second internal power supply voltage.

10. The semiconductor memory device according to claim 9, wherein said power supply circuit generates a plurality of reference voltages in accordance with said plurality of number of times of down-conversion based on said third internal power supply voltage, and down-converts said third internal power supply voltage the plurality of number of times using the generated plurality of reference voltages to generate said second internal power supply voltage.

11. The semiconductor memory device according to claim 9, wherein
said power supply circuit includes
a booster circuit boosting said external power supply voltage to generate the third internal power supply voltage having the voltage level higher than the voltage level of said first internal power supply voltage,
a first reference voltage generating circuit down-converting said third internal power supply voltage to generate a first reference voltage,
a first down converter circuit down-converting said third internal power supply voltage to a voltage level of said first reference voltage to generate said first internal power supply voltage,
a second reference voltage generating circuit down-converting said first internal power supply voltage to generate a second reference voltage, and
a second down converter circuit down-converting said first internal power supply voltage to a voltage level of said second reference voltage to generate said second internal power supply voltage.

12. The semiconductor memory device according to claim 2, wherein said power supply circuit generates said first internal power supply voltage by changing a boosted level in accordance with a type of a command signal.

13. The semiconductor memory device according to claim 12, wherein said power supply circuit, when a current supplied to the semiconductor memory device is less than a current in a normal operation mode, uses the first reference voltage having a first voltage level to generate said first internal power supply voltage having a third voltage level, and, when the current supplied to the semiconductor memory device is equal to the current in the normal operation mode, uses the second reference voltage having a second voltage level higher than said first voltage level to generate said first internal power supply voltage having a fourth voltage level higher than said third voltage level.

14. The semiconductor memory device according to claim 12, wherein
said power supply circuit includes
a reference voltage generating circuit generating a plurality of reference voltages having different voltage levels from each other, and selecting and outputting one of the generated reference voltages corresponding to the type of said command signal,
a booster circuit boosting said external power supply voltage to a voltage level of the reference voltage received from said reference voltage generating circuit to generate said first internal power supply voltage, and
a down converter circuit down-converting said first internal power supply voltage received from said booster circuit to generate said second internal power supply voltage.

15. The semiconductor memory device according to claim 2, wherein said second internal power supply voltage has a voltage level that is higher than a voltage level of said external power supply voltage.

* * * * *